United States Patent [19]
Hosokawa et al.

[11] Patent Number: 5,422,516
[45] Date of Patent: Jun. 6, 1995

[54] ELECTRONIC PARTS LOADED MODULE INCLUDING THERMAL STRESS ABSORBING PROJECTING ELECTRODES

[75] Inventors: Takashi Hosokawa, Hitachi; Hirokazu Inoue, Ibaraki; Mamoru Sawahata; Masaki Fukuoka, both of Hitachi, all of Japan

[73] Assignee: Hitachi, Ltd., Tokyo, Japan

[21] Appl. No.: 880,520

[22] Filed: May 8, 1992

[30] Foreign Application Priority Data

May 9, 1991 [JP] Japan .................................. 3-104117

[51] Int. Cl.$^6$ ...................... H01L 23/48; H01L 29/44; H01L 29/52; H01L 29/60
[52] U.S. Cl. ................................. 257/775; 257/692; 257/784; 257/780
[58] Field of Search ............... 257/723, 724, 777, 778, 257/779, 775, 704, 780, 781, 692, 784; 228/180.2

[56] References Cited

U.S. PATENT DOCUMENTS

| | | | |
|---|---|---|---|
| 3,373,481 | 5/1968 | Lins et al. | 228/180.2 |
| 4,173,768 | 11/1979 | Denlinger et al. | |
| 4,250,520 | 2/1981 | Denlinger | |
| 4,545,610 | 10/1985 | Lakritz et al. | 228/180.2 |
| 4,673,772 | 6/1987 | Satoh et al. | 228/180.2 |
| 4,818,728 | 4/1989 | Rai et al. | 257/777 |
| 4,845,542 | 7/1989 | Bezuk et al. | 257/777 |
| 4,930,001 | 5/1990 | Williams | 257/737 |
| 5,151,773 | 9/1992 | Matsui et al. | 257/704 |
| 5,189,507 | 2/1993 | Carlomagno et al. | 257/724 |

FOREIGN PATENT DOCUMENTS

| | | |
|---|---|---|
| 0405865A2 | 6/1990 | European Pat. Off. |
| 8814326 | 11/1988 | France |
| 2170548 | 12/1988 | Japan |
| 168640 | 6/1990 | Japan |
| 207592 | 8/1990 | Japan |

OTHER PUBLICATIONS

IBM Technical Disclosure Bulletin, vol. 33, No. 7, Dec. 1990: "Direct Chip Bonding for Liquid Crystal Display".
IBM Technical Disclosure Bulletin, vol. 24, No. 5, Oct. 1981: "Chip-to-Substrate Interconnection".

*Primary Examiner*—Jerome Jackson
*Assistant Examiner*—S. V. Clark
*Attorney, Agent, or Firm*—Antonelli, Terry, Stout & Kraus

[57] ABSTRACT

An electronic parts loaded module comprises a circuit board having electronic parts connected thereto via a plurality of projecting electrodes, in which two or more of the plurality of projecting electrodes for connecting the electronic parts have a narrowed portion between one end adjacent to the boundary for connection with the electronic parts and the other end adjacent to the boundary for connection with the board, the narrowed portion having a cross-section which has different dimensions in crossing directions, or a minor axis and a major axis different in length from each other. The projecting electrodes are disposed in a manner as the larger dimension or the major axis being aligned along the periphery or the side of the electronic parts, or as surrounding the central area of the surface, on which the electronic parts are loaded. The module can be used in IC cards and liquid crystal display apparatuses and the like.

9 Claims, 19 Drawing Sheets

PARALLEL TO THE THERMALLY STRESSED DIRECTION

NORMAL TO THE THERMALLY STRESSED DIRECTION

⟵——⟶  TENSILE STRESS

⟶——⟵  COMPRESSION STRESS (1) METAL ELECTROLYTIC PLATING (2) PHOTOETCHING (3) ELECTROLYTIC PLATING (4) REMOVAL OF RESIST / FINISH

ELECTRONIC PARTS LOADED MODULE INCLUDING THERMAL STRESS ABSORBING PROJECTING ELECTRODES

BACKGROUND OF THE INVENTION

1. Field of the Invention

The present invention relates to an electronic parts loaded module, and more particularly, to a module loaded with electronic parts via projecting electroconductive electrodes on a circuit board, a method for manufacturing the same, and a device having such an electronic parts loaded module.

2. Description of Related Art

Conventional electronic parts include semiconductor devices such as silicon chips, resistor chips such as silicon substrates having resistors formed thereon, capacitor chips such as silicon substrates having multilayered dielectric elements coated thereon, and the like. The electronic parts loaded module has fine connections for effecting electric communications, which may cause the following problems when a significant difference in thermal expansion between the electric parts and the underlying substrate exists. The problems will be explained with respect to semiconductor devices hereunder, but they may be also produced with other electronic parts.

The semiconductor devices have been generally made with a number of connections disposed spacing from apart each other, the pitch of which has been made smaller and smaller. The tendency that the number of connection points per semiconductor device has been ever increasing has assisted in promoting that the connection pitches are made much finer. Typical examples of the semiconductor devices with fine connection pitches are integrated circuits for operating liquid crystal display devices. Moreover, it is difficult to provide a multi-layer circuit on a liquid crystal display substrate, so that connection terminals are formed to concentrate in the peripheral regions of an IC chip, which results in requiring further reduced pitches.

Means for connecting the connection terminals aligned straight along the periphery of the IC chip to a circuit board is generally wire-bondings or Tape Automated Bonding (TAB) with polyimide based tapes. However, the use of these means are limited due to connection pitches. The former is limited because of the dimensions of bonding tools, while the latter is limited because of the accuracy of processing copper foils.

As structures independent of the limitations as described above, one may make mention such structures as the surface of a semiconductor device facing that of the circuit board as called face-down or flip chip bondings. This structure requires generally projecting electrodes to ensure electrical communication and insulation between the semiconductor device and the circuit board. Of course, the projecting electrodes are not necessarily required. There have been proposed a structure using no projecting electrode as disclosed in Japanese Patent KOKAI (Laid-open) No. Hei 2-84747. Alternatively, there may be a structure having connecting means interposed between the semiconductor device and the circuit board as disclosed in Japanese Patent KOKAI (Laid-open) Nos. Sho 57-28337, Hei 2-54946, and Hei 2-82545.

In view of practical aspects such as cost, mass productivity and the like, however, the technique in which the projecting electrodes are formed are most reasonable. Therefore, a number of patents have been published with respect to projecting electrodes. They can be further classified depending upon which the projections are formed on, the semiconductor device or the circuit board. The techniques forming the projections on the side of the circuit board are disclosed in Japanese Patent KOKAI (Laid-open) Nos. Sho 61-245543, Sho 62-161187, Sho 63-40331, Sho 63-92036, Sho 63-220533, Hei 1-273327, Hei 1-281433, Hei 2-28340, Sho 62-35597, and Sho 63-70888. Particularly, in case the semiconductor devices are loaded only on the periphery of a large type circuit board as liquid crystal display devices, the number of the projections to be formed is fairly small relative to the surface area of the board to be used so that the use of the aforementioned structure is conceivably disadvantageous in cost.

In contrast, the structure where the projections are provided on the semiconductor device is more reasonable as described in a greater number of patent applications. As materials for the projections, Au (gold) is most popular to be found in many patent applications including Japanese Patent KOKAI (Laid-open) No. Sho 60-85545. Alternatively, the use of solders is one of remarkable examples making use of the higher ductility characteristic of the alloy. Japanese Patent KOKAI (Laid-open) Nos. Hei 2-37724, Sho 63-9136, Sho 62-287647, and Sho 63-122155 may be mentioned. In any case, soft materials are selected. As discussed hereinafter, first object is to relax the stress caused by a difference in thermal expansion between the semiconductor device and the circuit board. Plating is a generic technique for forming the projections, although the utilizing of wires has attracted interest as disclosed in Japanese Patent KOKAI (Laid-open) Nos. Sho 63-304587 and Sho 61-117846.

In any technique as described above, the spacing between the semiconductor device and the circuit board is inevitably reduced as the connection pitch is reduced. As a result, a greater stress is developed between the semiconductor device and the circuit board owing to the difference in thermal expansion therebetween. An attempt has been proposed to disperse and relax the stress by disposing a resin between the semiconductor device and the circuit board as described in NIKKEI MICRODEVICE, July 1989, pp. 46-47.

However, this structure suffers from a drawback of instability in its reliability depending upon the physical properties of the resin as pointed out in the Journal of Electronic Information Communicating Society, Vol. J73-C-II, No. 9, pp. 516-524 (1990.9). It is important, therefore, to provide a structure capable of achieving the relaxation of the stress without using resins.

A bump formed on an electrode pad has generally a circular cross-section in a plane. Alternatively, another technique where the cross-section in a plane of a bump formed has different dimensions in normally crossing directions, i.e., one larger diameter and the other shorter diameter can be mentioned as described in Japanese Patent KOKAI (Laid-open) Nos. Hei 2-170548 and Hei 1-243533. In the former, the bump is formed with solder to have an ellipse cross-section in a plane, the shorter axis of which is along the direction directing to the center of the chip as illustrated in Examples of the patent. However, this technique is for allowing the chip and the circuit board to abut with each other at high accuracy in their positions. In contrast, in the latter, projecting electrodes have a dumb-bell configuration in a plane. This is for enhancing not only the shear strength in the longitudinal direction of the bump, but also that in the direction of the shorter dimension. Both two techniques as described above employ solder, but they fail to take into consideration the relaxation of the thermal stress applied to the bump by deformation thereof.

When the bump is fromed to have a dumb-bell cross-section, the thermal stress imposed on the bump can be dissipated owing to flexure of the narrowed part of the bumb-bell shape. This scheme is disclosed in Japanese Patent KOKAI (Laid-open) No. Sho 61-43438. In this scheme, however, the bump does not have any anisotropy in rigidity.

As discussed above, the prior arts disclose no technique to essentially cope with the difficulty of avoiding the difference in thermal expansion between the electronic parts and the circuit board.

SUMMARY OF THE INVENTION

An object of the present invention is to provide an electronic parts loaded module capable of dissipating the stress caused by a difference in thermal expansion between the electronic parts and the circuit board without relying on the relaxation of the stress by means of resins disposed between the electronic parts and the circuit board which is taught by the prior art as described above.

DETAILED DESCRIPTION OF PREFERRED EMBODIMENTS

Figure 1:
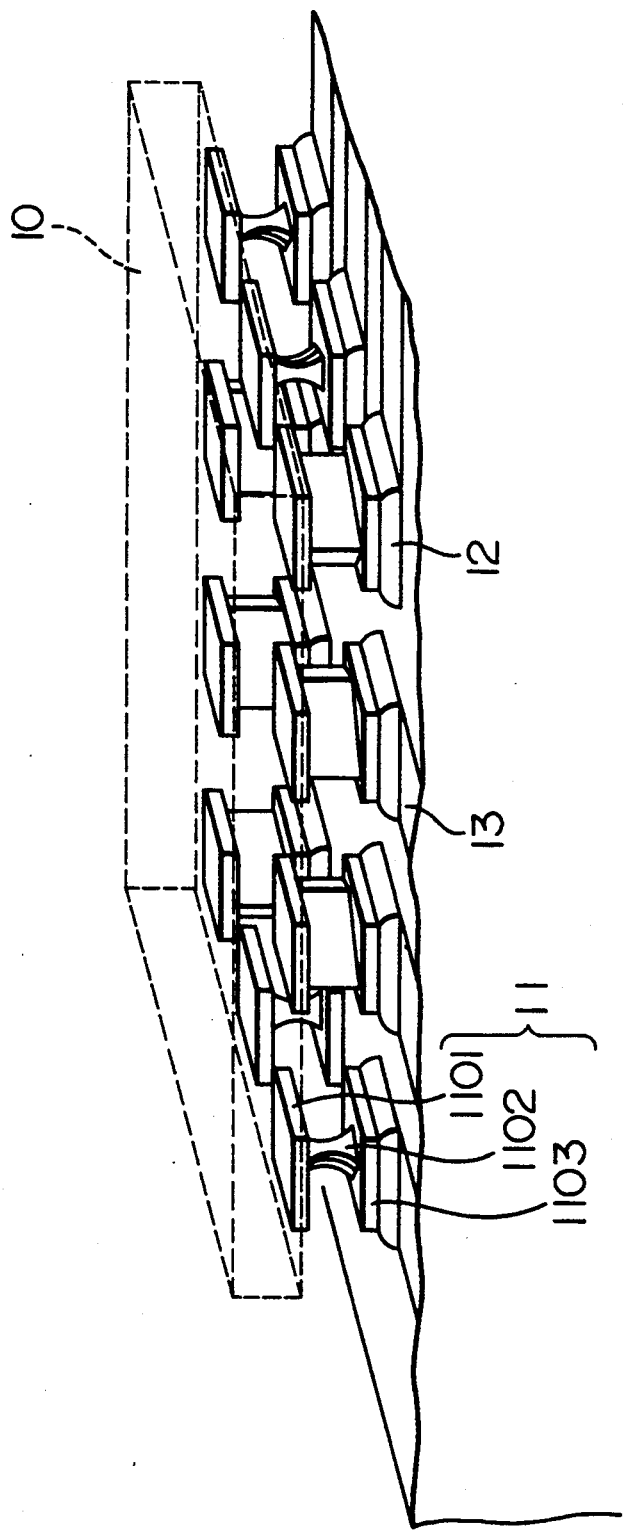
FIG. 1 is a perspective view of an example of the first embodiment of the present invention.

The present inventors have made an intensive research to achieve the aforementioned object and as a result thought of a structure which can dissipate the stress through projecting electrodes. In this regard, since the height of the projecting electrodes is lower as the connection pitch is smaller, as described earlier, the projecting electrodes are required to be thinner in order to achieve satisfactorily the effect of relaxing the stress. If the projecting electrodes are made thinner, however, the ability of supporting physically the semiconductor device is reduced. In order to satisfy the opposing requirements, the projecting electrodes are modified to have specific structure and arrangement.

That is, there is provided an electronic parts loaded module having a connection structure of a so-called face down or flip chip bonding type where the electronic parts and a circuit board are bonded facing to each other, characterized in that electroconductive projecting electrodes provided on the surfaces of the electronic parts or the circuit board are made to have such a configuration as a narrowed part being present between the electronic part on one end and the circuit board on the other end, and that the narrowed part has a cross-section having different dimensions in the crossing directions in a plane, e.g., a minor axis and a major axis different in length from each other.

Moreover, having the above defined structure, the projecting electrodes are disposed in an arrangement where the direction of the longer dimension, i.e., the major axis is substantially along the periphery or the edges of the electronic parts.

The present invention will be more practically described hereunder.

First, within the basic structure of the present invention as described above, the following various modifications can be made without limiting to Examples as described later.

(a) The projecting electrodes may be fromed on the circuit board.

(b) The projecting electrodes having a plurality of projections are formed on a common seat with the tips being disposed separately or in common as illustrated in Examples, though they may be formed on respective seats.

(c) The projections, the tips, and the seats may be made of different materials, respectively. Of course, the projections may be composed of a combination of different materials (for an inner protion, outer protion, central protion, and the like).

A process for manufacturing the electronic parts loaded module having the structure as described above is not limited to those illustrated in Examples, but any known conventional processes for the manufacture may be employed.

Moreover, the present invention does not necessarily require filling resins and the like along the periphery of the projecting electrodes disposed between the electronic parts and the circuit board, and alternatively, highly adhesive resins may be filled in the space between the electronic parts and the circuit board.

In the connection structures of the so-called face down or flip chip type, the main stress which developes on the connections between the electronic parts and the circuit board is a thermal stress owing to the difference in thermal expansion coefficient therebetween. For example, an IC for driving liquid crystal display devices includes connection terminals disposed almost uniformly along the periphery of the semiconductor device. The thermal stress due to the difference in thermal expansion coefficient between the semiconductor device and the circuit board occurs radially from the cental portion of the semiconductor device with the center being a neutral point. On each connection terminal, a stress directing to the center of the semiconductor device is imposed. Since the semiconductor device is made of silicon, it has a thermal expansion coefficient as low as $3 \times 10^{-6}/°$ C. while the circuit board has generally a higher thermal expansion coefficient than that of silicon. For example, the thermal expansion coefficient of soda glass is about $1 \times 10^{-5}/°$C. Therefore, an increase or decrease in the temperature allows the semiconductor device and the circuit board to cause a displacement relative to each other.

That stress developed due to the displacement is the thermal stress of interest here. In order to suppress the development of the thermal stress, an effective attempt is to enlarge the distance between the semiconductor device and the circuit board as a direct technique for solving the problem. When the connection pitch is smaller, however, it becomes difficult to make the gap between the connections larger. For example, in the examples disclosed in Japanese Patent KOKAI (Laid-open) No. Sho 57-28337, the connection gap is 300 μm or more, but if this value is employed together with a connection pitch of 50 μm and a diameter of the connection terminal of 25 μm, the relationship between the connection pitch and the connection gap may be figured as an arrangement having long and thin wires aligned very closely to each other. The 25 μm diameter of the connection terminal is almost equal to the diameter of the wires for the wire bondings. The wires having a diameter in this order and a length of about 300 μm is deformed by a slight external force. For this reason, various problems are produced. For example, handlings before or after connecting is performed may cause contact of adjacent terminals with each other, or bending of connection terminals with a slight external force whereby it is impossible to retain the gaps. However, the most serious problem in practice is not any one of such problems, but that it is difficult to realize such arrangement in practically acceptable cost. If this arrangement can be realized at a low cost, and in addition if the deformation of the connection terminals can be suppressed into a small one, it may be said that the arrangement has an ideal configuration.

As such arrangement is difficult to realize at present, there is a need to achieve the sufficient relaxation of the stress with small connection gaps realizable at a practically acceptable cost. For that, the connection terminals must be made to have a smaller cross-section in a plane. Although the development of the thermal stress may be suppressed into a small one by reducing the cross-section, however, resistance against other loadings is also reduced at the same time.

Figure 6:
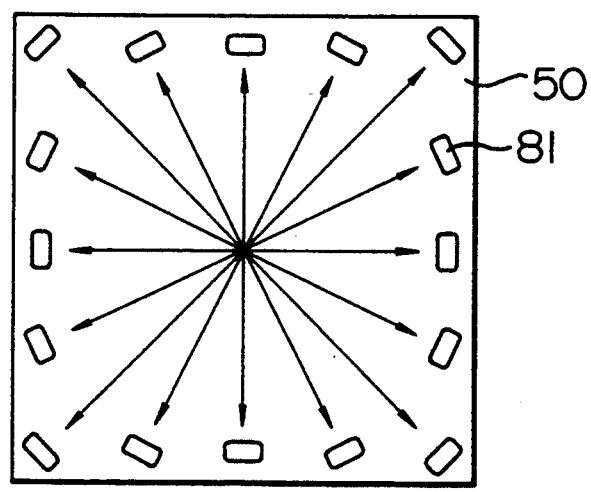
FIG. 6 is a plane view for explaining the function according to the present invention.

The present inventors noticed that the magnitude of the stress developed is proportional to the square of the diameter of the connection terminal in a plane parallel to the stressed direction while in a plane normal thereto the diameter does not have any influence on the stress. As terminals connecting the semiconductor device and the circuit board, projecting electrodes formed on the ends of aluminum lines on the side of the semiconductor device were taken into consideration. A projecting electrode is composed of three portions, i.e., a seat to be in contact with the end of the aluminum line on the side of the semiconductor device, a column-shape projection having opposite flared ends, and a flared tip for connection. A board connection provided on the tip of the conductive line 82 on the circuit board is connected with the tip of the projection by means of conductive adhesive. The projection has a cross-section of the shape having different widths depending upon directions in a plane such as oval or ellipse, flat polygon like ellipse, flat polygon with round corners rather than regular polygon or circle. In addition, the projections are arranged in a manner as their shortest dimension in the cross-section being aligned along the stressed direction which has an influence on the life of the connections. That is, as shown in FIG. 6, the arrangement where projecting electrodes 81 are radially disposed with their shortest dimensions in the cross-section being aligned along the thermally stressed direction occurred to us. In this arrangement, the magnitude of the thermal stress owing to the relative displacement which generates in the radial direction is reduced, and moreover, other forces which may be applied to the whole semiconductor device 50 are counteracted by all the connection terminals which act as a cylindrical pillar having a high rigidity as a whole. Thus, this arrangement provides an ideal connection structure.

Figure 7A:
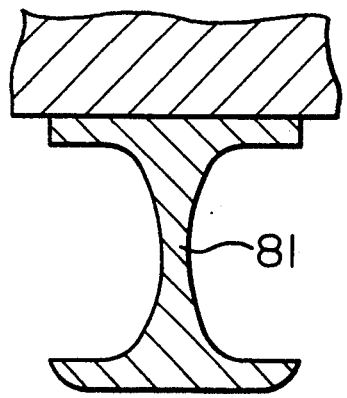
FIGS. 7A and 7B are a cross-sectional views for explaining the function according to the present invention.
Figure 7B:
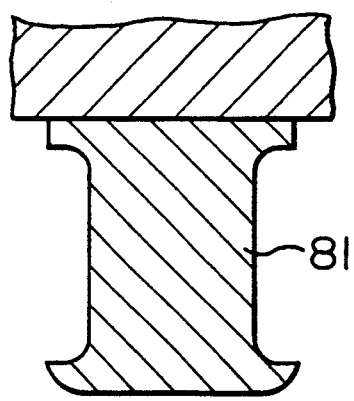

Furthermore, with respect to a stress distribution inside the connection terminal, we notised that the stress concentrates in the root and the tip of the projecting electrode, these portions should be enlarged in their cross-section for stress relaxation as a matter of importance, and that the projections should have effectively flares at opposite ends. Detail cross-section of a typical projecting electrode satisfying the requirements as described above is shown in FIG. 7. The projecting electrode 81 has a thin cross-section in a plane in the parallel direction to the thermally stressed direction and a broad one in the normal direction thereto.

Figure 25A:
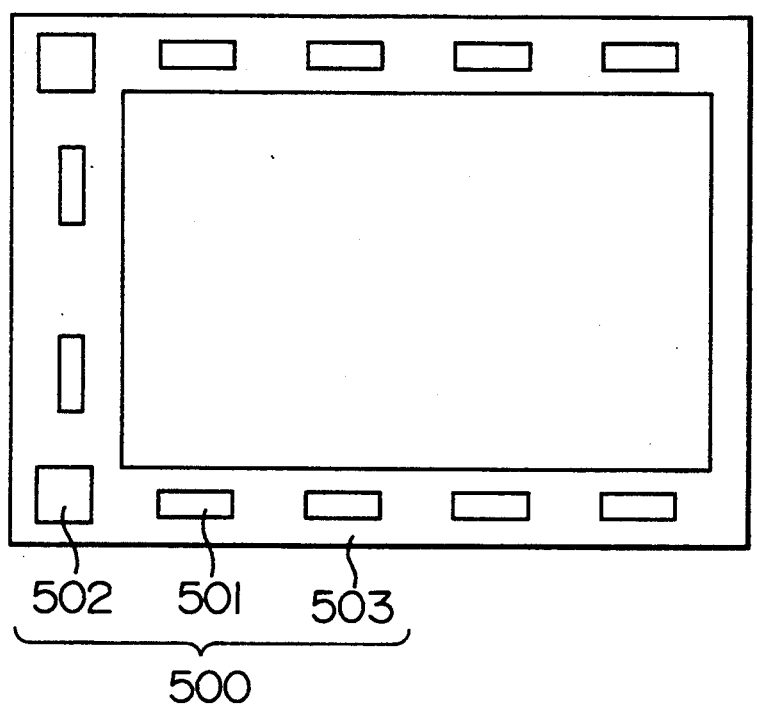
FIG. 25A is a plane view of an example of the electronic parts loaded modules according to the present invention.
Figure 25B:
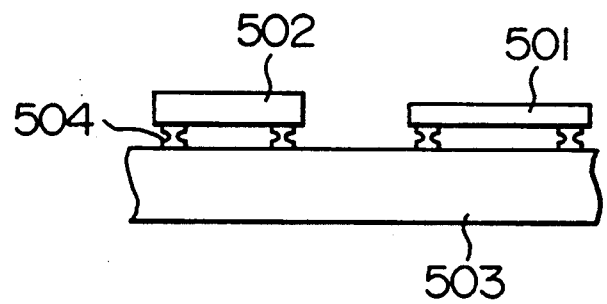
FIG. 25B is a cross-sectional view of the electronic parts loaded module as shown in FIG. 25A.

FIGS. 25A and 25B show an example of the electronic parts loaded module as described above in detail.

As can be seen from FIG. 25A and 25B, an electronic parts loaded module 500 designates the combination of a substrate and electronic parts loaded thereon such as semiconductor devices 501, chips 502 having resistors and capacitors formed on a silicon substrate and the like. The use of the projecting electrodes 504 for connection of the substrate 503 and the electronic parts 502 enables effective relaxation of the thermal stresses generated in the connections as well as other forces to be applied to the electronic parts during operation thereof. Therefore, the structure of the module according to the present invention is useful not only for the semiconductor devices 501, but also for other electronic parts such as the chips 502 having resistors and the like formed.

The present invention will be practically illustrated with reference to Examples. The present invention is not limited to those Examples.

Examples 1 to 13 of the present invention will be described with reference to FIGS. 1 to 24.

EXAMPLE 1

The first embodiment of the present invention is described here with reference to FIGS. 1 to 4A and 4B.

Figure 2:
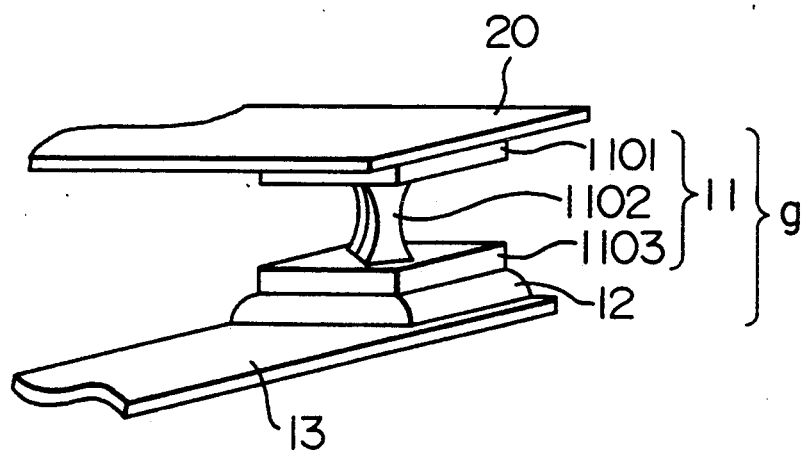
FIG. 2 is a perspective view of an example of the first embodiment of the present invention.
Figure 3:
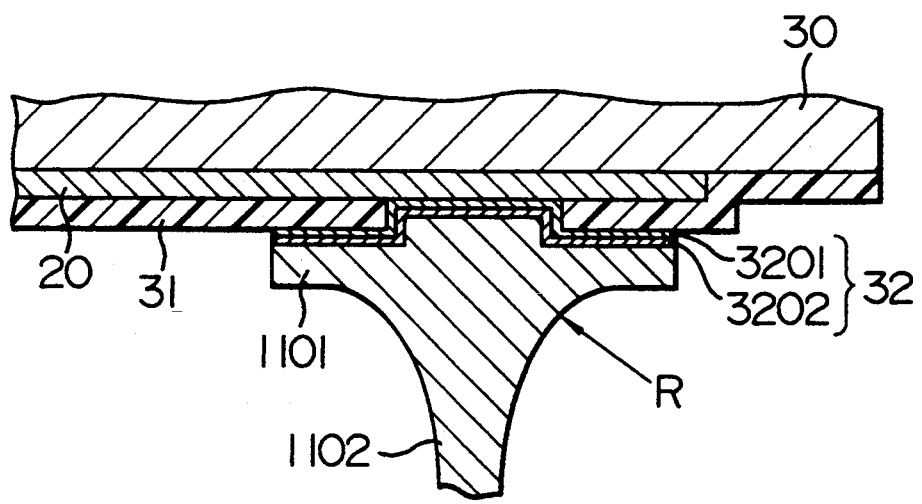
FIG. 3 is a cross-sectional view of an example of the first embodiment of the present invention.
Figure 4A:
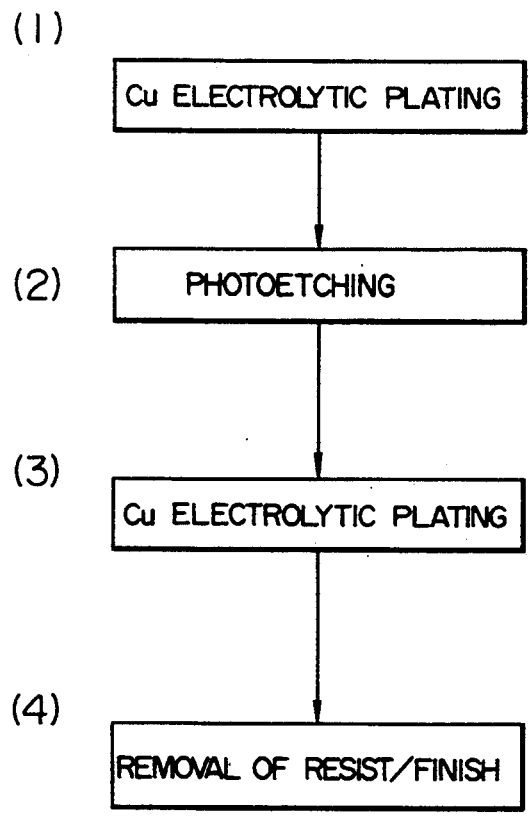
FIG. 4A is a flow sheet diagram of an example of the first embodiment of the process of the present invention.
Figure 4B:
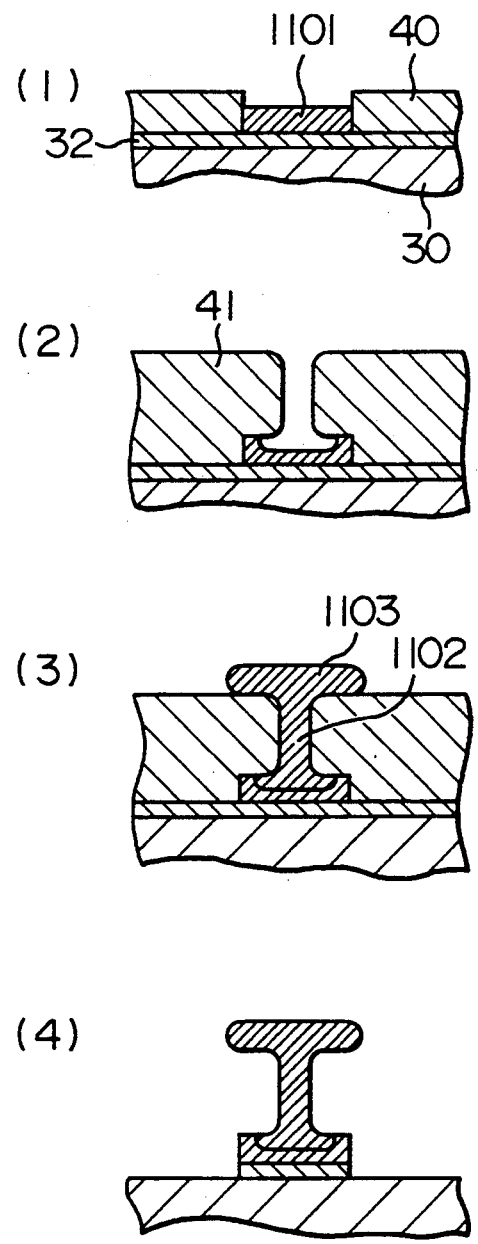
FIG. 4B shows schematic cross-sectional views corresponding to the steps of an example of the first embodiment of the process of the present invention.
Figure 5:
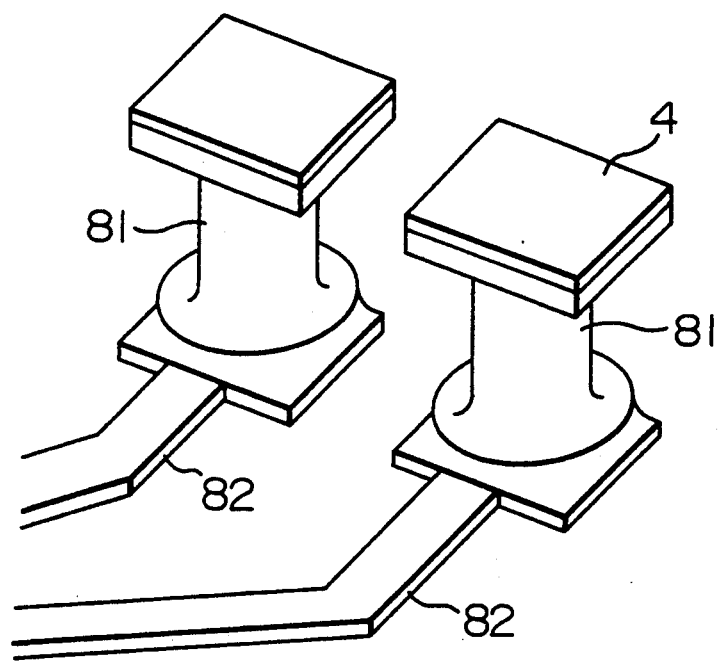
FIG. 5 is a plane view for explaining the function according to the present invention.

FIG. 1 is a perspective view of an example of the first embodiment of the present invention as viewed diagonally from the upper side. FIG. 2 is an enlarged perspective view of a connection terminal. FIG. 3 is a partially enlarged cross-sectional view of a part of the structure as shown in FIG. 2. FIG. 4A is a flow sheet diagram of an embodiment of the process of the present invention and FIG. 4B shows cross-sectional views corresponding to steps of the process. In FIG. 1, for avoiding complexity, the semiconductor device 10 is drawn with dotted line and all the structure inside the semiconductor device 10 including aluminum lines are omitted. Similarly, in FIG. 2, the semiconductor device 10 other than an aluminum line 20 and the glass substrate are omitted. In FIG. 3, functional parts such as transistors, diodes, resistors, capacitors and the like and the lines for connecting them included in the semiconductor device 10 are omitted and is shown as a silicon substrate 30 as a whole. The cross-sections shown are taken in a plane parallel to the thermally stressed direction.

Semiconductor device package structure of an example according to the present invention comprises a glass substrate 14 having transparent conductive lines of ITO (mixed indium/tin oxide) formed on the surface thereof and a semiconductor device 10 having projecting electrodes 11 preformed thereon which are connected with the conductive lines by means of electroconductive adhesive 12. The projecting electrodes 11 have an enlarged protion for connection with the semiconductor device 10, which protion is referred to as seat 1101. In order to assure the connection with the electroconductive adhesive 12, the tip 1103 is also enlarged. The central protion is a projection 1102 which is shown in the form of thin plate in the FIGURE, but It has a most thin protion having a oval cross-section in a plane parallel to the glass substrate 14 and the semiconductor device 10. As seen from FIG. 1, the projections 1102 are disposed in spaced relation along a substantially cylindrical shape as a whole, which is similar to the arrangement, e.g., as shown in FIG. 6 when viewed from directly above. This arrangement is flexible to the thermal stress and exhibits a sufficient rigidity to withstand external forces and other loads. Although only ten projecting electrodes 11 are depicted in FIG. 1 as a result of abbreviation for making the structure easily perceptible, in fact 192 projecting electrodes were disposed. The semiconductor device 10 has a square shape of a 4 mm side, each side having 48 projecting electrodes aligned with a pitch of 80 $\mu$m. The gap designated as g in FIG. 2 has a total distance of the thickness of the projecting electrode 11 (which is a total of the thickness of the seat 1101, the hight of the projection 1102 and the thickness of the tip 1103) and the thickness of the electroconductive adhesive 12, e.g., about 25 $\mu$m. In more detail description, there are practically the seat 1101 having a thickness of 5 $\mu$m and the aluminum line 20, between which a plated primer film 32 consisting of a thin film laminate of chromium film 3201 having a thickness of 100 nm and a gold film 3202 of 500 nm is provided. This primer film aids inhibition of interdiffusion between the aluminum line 20 and the copper of the projecting electrode 11 as well as supply of electric current for plating the projecting electrode 11. The projection 1102 is flared (designated by R in FIG. 3) at its opposite ends for connections with the seat 1101 and the tip 1103 in order to avoid the stress concentration into the connections. This flare has a radius of curvature of 15 $\mu$m. The projection 1102 has a cross-section having a short dimension of 2 $\mu$m at the thinnest central portion in the thermally stressed direction and a large dimension of 30 $\mu$m in the normal direction thereto. Both the seat 1101 and the tip 1103 have a square shape of a 40 $\mu$m side.

An embodiment of the process of the present invention will be described with reference to FIGS. 4A and 4B. FIG. 4A is a flow sheet diagram and FIG. 4B shows cross-sectional views corresponding to steps, respectively. In the FIGURE, the plated primer film 32 is depicted as a single layer film for abbreviation, though it is composed of a two-layer laminate consisting of the chromium film 3201 and the gold film 3202 as explained above. Other structure including the aluminum lines 20 and a surface protecting film 31 than the plated primer film 32 is omitted and designated as a silicon substrate 30 as a whole.

(1) The seat 1101 was formed by patterning with resist 40 and then electrolytically plating into a thickness of 5 μm. The resist used was of positive type and correspondingly the plating bath was an acidic copper sulfate solution.

(2) The resist 40 was removed and a resist 41 of a thickness of about 20 μm was provided. Under this conditions, a part of the seat 1101 was removed by etching with a solution containing major components, $(NH_4)_2S_2O_5$ and $NH_4I$.

(3) Making use of the resist 41, an electrolytic plating was effected to produce the projection 1102 and the tip 1103.

(4) The resist 41 was removed and the plated primer film 32 was etched out using the seat as a mask.

With the glass substrate 14 having a relatively low thermal expansion coefficient of $4 \times 10^{-6}$, when the temperature was raised from the normal temperature (20° C.) to 80° C., a maximum displacement of the semiconductor device 10 relative to the glass substrate 14 was about 0.3 μm. Owing to this displacement, the projection 1102 suffered a plastic deformation. A maximum stress generated on the projection 1102 reached to about 15 kg/mm². However, the stress was relaxed to about 0.5 kg/mm² at the boundary between the seat 1101 and the underlying aluminum line 20 as well as at the boundary between the tip 1103 and the electroconductive adhesive. This value is sufficiently small to retain the boundaries unaffected. As a result, the structure could passed the test for a temperature cycle from −30° C. to 85° C. Failure occurred, if any, at the projection 1102. Because a part of the seat 1101 is previously etched out, the plated connection which tends to be weak in stress is apart from the boundary between the seat 1101 and the projection 1102, into which boundary the stress is most concentrated, so that the structure has a very high reliability.

EXAMPLE 2

The second embodiment of the present invention will be illustrated with reference to FIGS. 8 and 9.

Figure 8:
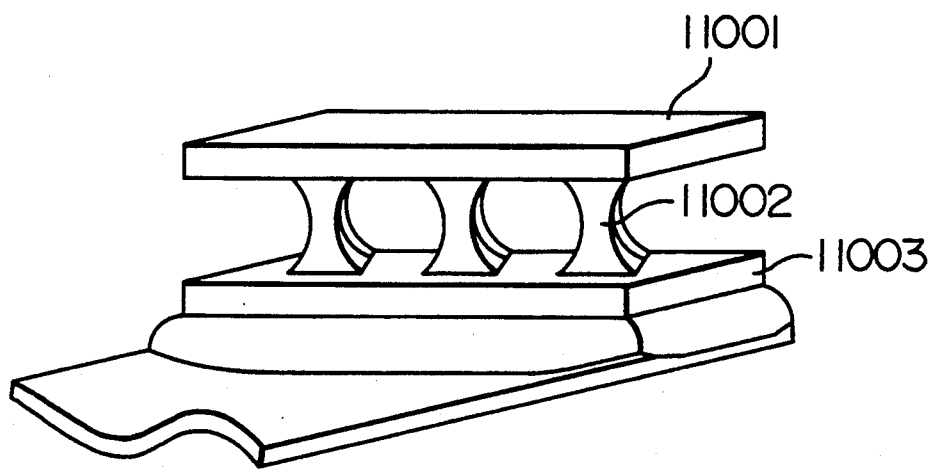
FIG. 8 is a perspective view for explaining the function according to the present invention.

FIG. 8 is a perspective view of a part of an example of the second embodiment of the present invention as viewed diagonally from above. FIG. 9 is a plane view of a part of an example of the second embodiment of the present invention as viewed from the side of the glass substrate. In FIG. 8, for avoiding complexity, the overall semiconductor device including aluminum lines and the glass substrate is omitted. In FIG. 9, for the same reason, the parts within the semiconductor device, the tips of the projections, the electroconductive adhesive and the glass substrate are omitted.

In this example, a plurality of projections are provided at one connection place. FIG. 8 shows an example where three projections 11002 are disposed parallelly to the thermally stressed direction. This structure is such that the three projections possess commonly a seat 11001 and a tip 11003.

A process for manufacturing this structure is essentially the same as in Example 1, except that the pattern of the resist 41 in FIG. 4 is changed to have three apertures, and therefore, description of the process will be omitted.

Figure 9:
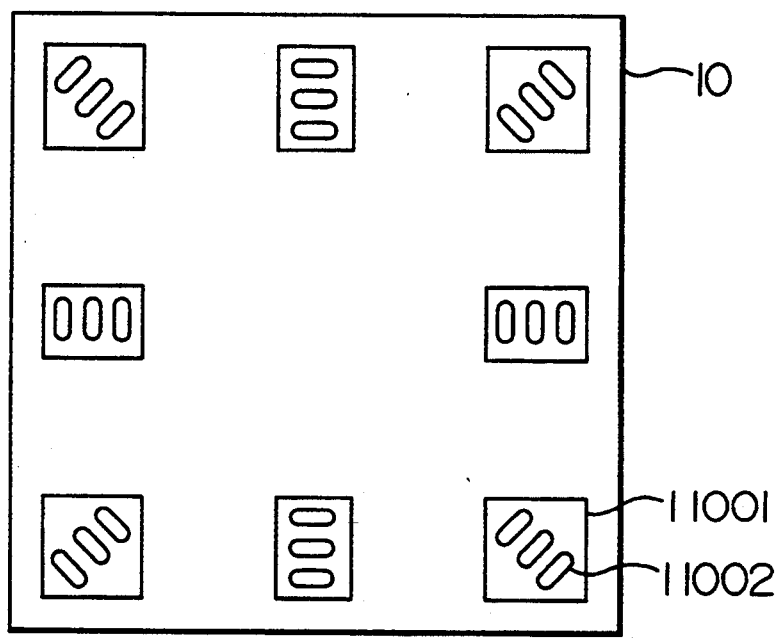
FIG. 9 is a plane view of an example of the second embodiment of the present invention.

FIG. 9 shows an arrangement of the projections in this example. The projections in this example have the identical width to that in Example 1 in the direction parallel to the thermally stressed direction. The three projections 11002 amount to have the same dimension in the direction normal to the thermally stressed direction in all as that of one projection in Example 1, and therefore, are identical in mechanical properties to the latter one. However, an area on the semiconductor device 10 required for a projecting electrode in this Example is smaller than that in Example 1. If the spacing between the projecting electrodes is the same, therefore, a higher number of projecting electrodes can be formed. Moreover, with the same number of projecting electrodes as shown in FIG. 9, the spacing between the projecting electrodes can be increased.

As a matter of course, the number of the projections 11002 is not necessarily three as illustrated here, but may be optionally selected to be two or more, if necessary.

Next, first variation of the second embodiment will be described. Unlike Example 2, three projections are aligned in the direction normal to the thermally stressed direction. A group of the three projections acts identically to one projection which has the same width as that of any one of the three projections in the parallel direction to the thermally stressed direction and the identical dimension in the normal direction to the total of the dimensions in the same direction of the group.

A process for manufacturing the projecting electrodes in this Example is the same as that of Example 2, except that the resist pattern is different from that in Example 2. Therefore, description of the process will be omitted.

This structure has advantages that a gap is present between the projections, which is beneficial to a process including the step requiring the gaps between the projections as filling resin into between the semiconductor device and the glass substrate.

Of course, the number of the projections is not necessarily three as illustrated here, but may be optionally selected to be two or more, if necessary.

Second variation of the second embodiment will be described. Two projections are aligned in the parallel direction to the thermally stressed direction as well as in the normal direction. A group of the four projections acts identically to one projection which has the same width as that of any one of the two projections in the parallel direction to the thermally stressed direction and the identical dimension in the normal direction to the total of the dimensions in the same direction of the group.

A process for manufacturing the projecting electrodes in this Example is the same as that of Example 2, except that the resist pattern is different from that in Example 2. Therefore, description of the process may be omitted.

This structure has advantages that it exhibits intermediate properties between the second embodiment and the first variation, which is beneficial to a step requiring the gaps between the projections while possessing characteristics capable of reducing the area of the pad.

Of course, the number of the projections is not necessarily four as illustrated here, but may be optionally selected to be three or more, if necessary.

Third variation of the second embodiment will be described. Basically it has a structure very like that of Example 2. Only one difference is that the tip is branched.

A process for manufacturing the projecting electrodes in this Example can be performed identically to that of Example 2, except that when plating is effected, plating conditions are selected or the resist pattern is planned so as to avoid contact of the tips with each other.

This has almost the same advantages as the second embodiment. In addition, it has advantages that the tip is more flexible than in Example 2 and that the flexibility of electroconductive adhesive is fully utilized to achieve more effective relaxation of the stress.

Of course, the number of the projections is not necessarily three as illustrated here, but may be optionally selected to be two or more, if necessary.

The three variations of the second embodiment as described above are characterized by the advantageous electric characteristic that an inductance component of the projections can be reduced. This characteristic is very useful particularly in application manipulating high frequency signals.

EXAMPLE 3

Third embodiment of the present invention will be described.

In this example, projecting electrodes were made to have a narrowest part which has an ellipse cross-section. In general, when a mask is oval, the resist becomes a rectangular shape with round corners. In the first and the second embodiments, the projections had a rectangular cross-section with round corners. In this example, the mask was of a shape close to an ellipse as shown rightside in FIGURE to allow the photoresist to have an ellipse cross-section. This shape reduces an increment of the thickness in the thermally stressed direction of the projections, when the thermally stressed direction is slightly displaced from the direction of the shorter dimension of the projections. Briefly, deterioration of performance caused when the thermally stressed direction is slightly displaced is reduced.

EXAMPLE 4

Figure 11A:
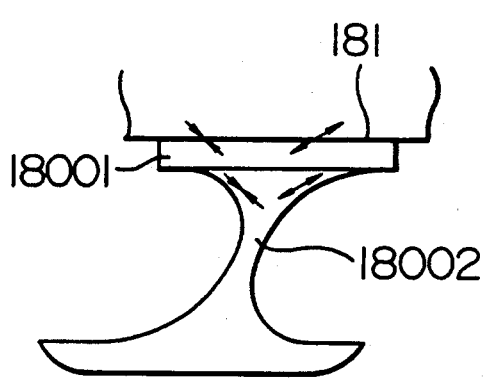
FIGS. 11A and 11B are a schematic cross-sectional view for explaining the function of the fourth embodiment of the present invention.
Figure 11B:
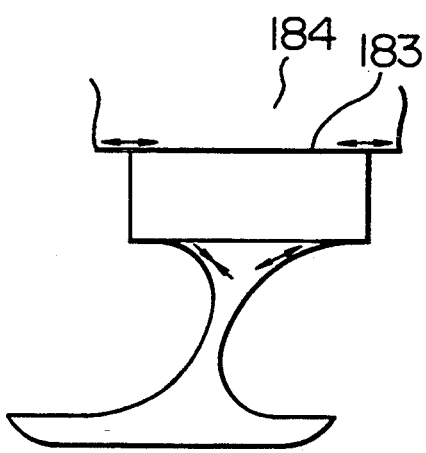
Figure 10:
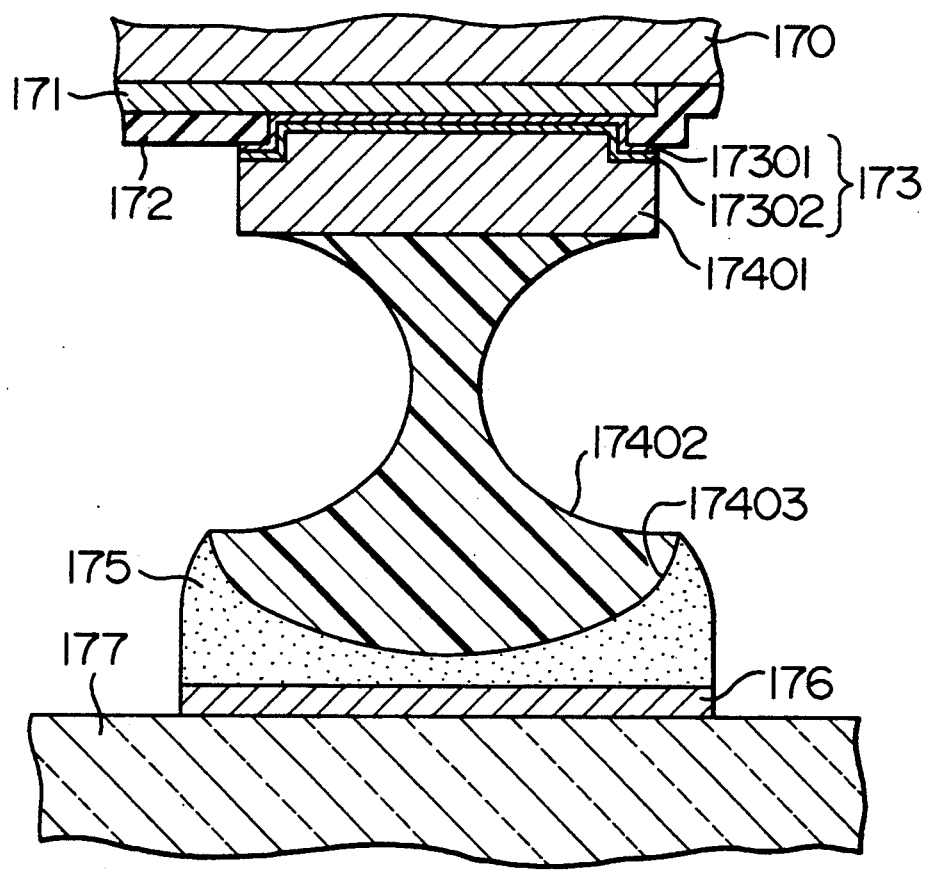
FIG. 10 is a partially enlarged cross-sectional view of an example of the fourth embodiment of the present invention.
Figure 12:
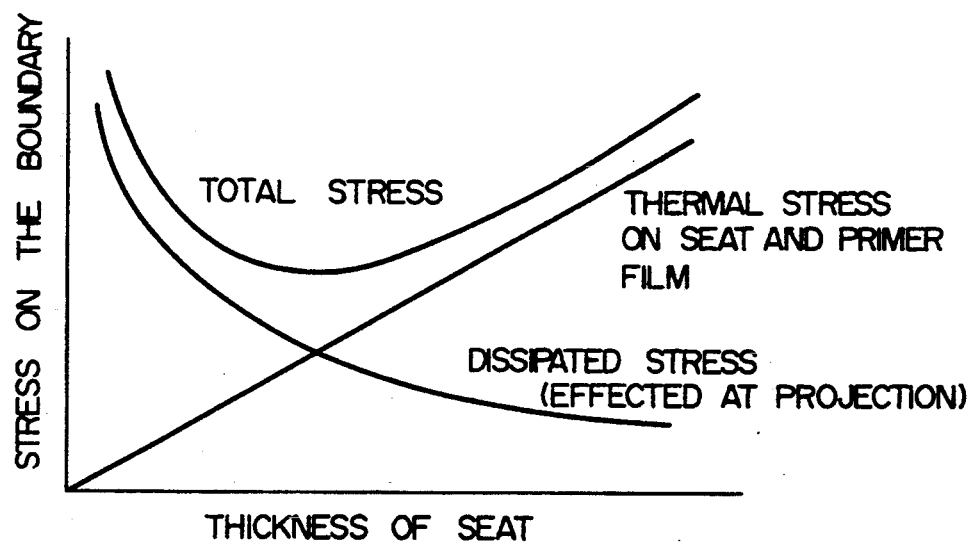
FIG. 12 is a graph showing the function of the present invention.

Fourth embodiment of the present invention will be described with reference to FIGS. 10 to 13. FIG. 10 is a partly enlarged cross-sectional view of an example of the present Example. FIG. 11A and 11B are a schematic cross-sectional view for explaining a difference in concentration of stress depending upon the thickness of the seat. FIGURE 12 is a graph showing the magnitude of boundary stress as a function of the thickness of the seat. FIG. 13 shows a flow sheet diagram and cross-sectional views corresponding to steps of the process for manufacture of this Example.

FIG. 10 is an enlarged cross-sectional view of a connection of this Example as shown in vertical cross-section in the direction parallel to the thermally stressed direction. Again, the internal structures of the semiconductor device are omitted for simplicity, and indicated simply as a silicon substrate 170. The end protion of an aluminum line 171 derived from the inside of the semiconductor device is provided with an aperture through a surface protecting film 172, and over the exposed protion of the aluminum a seat 17402 is formed by plating nickel via a plated primer film 173. The plated primer film 173 is composed of a chromium film 17301 and a gold film 17302. Unlike the structures as described earlier, a projection 17402 and a tip 17403 of the projecting electrode 174 are composed of an electroconductive resin. This resin is an epoxy resin containing fine gold particles. The seat 17401 has a thickness of 5 μm and the projection 17402 has a hight of 20 μm. The thinnest portion of the projection is of 2 μm. The tip 17403 is adhered onto a transparent electrode 176 on a glass substrate 177 with an electroconductive adhesive 175 of the epoxy resin containing fine gold particles.

In this example, as the projection is composed of the resin, the whole projecting electrode 174 has an increased flexibility and the thermal stress generated in the connection can be suppressed into a small level. The reason why any resin is not used for the seat 17401 is that (1) since metal has a higher rigidity than resin, it can effectively dissipate the stress on the projection, and (2) since metal does not have aqueous permeability, it can prevent the moisture from entering into the inside of the semiconductor device. Now we will discuss somewhat about the thickness of the seat with reference to FIGS. 11A and 11B showing the schematic views. The projection is stressed at maximum in the region of the boundary between the seat and the projection as indicated by arrows in the FIGUREs. It should be well understood that one of the stresses is tensile, while the other is compressive, as can be seen from exaggeratedly indicated deformations in the FIGURES. If the seat 18001 is thinner as shown in FIG. 11A, the stresses developed in the projection 18002 can not be sufficiently dissipated by the thinner seat 18001 so that they are transmitted to the boundary 181 almost as they are. In contrast, if the seat 18201 is thicker as shown in FIG-URE 11B, it is possible that the stresses developed in the projection 18202 are sufficiently dissipated throughout the inside of the thicker seat 18201. In this case, however, the thermal stress owing to the difference in thermal expansion coefficient between the thicker seat 18201 and a primer film 184 will be predominant, as indicated by arrows in the vicinity of the boundary 183 in FIG. 11B. As shown in FIG. 12, the thermal stress to be developed in the projection becomes greater as the thickness of the seat is increased. The stress developed in the projection is dissipated at the boundary into a lower level with approaching gradually reaching a constant value, when the thickness of the seat is increased. The resultant stress obtained by combining both stresses is the maximum stress to be developed at the boundary. Therefore, there is a thickness of the seat, with which the maximum stress developed at the boundary becomes the lowest. When the seat is made of resin, a smaller stress is developed, though resin is inferior in stress dissipating ability to metal. Therefore, resin seats should have a higher thickness than that of metal seats.

Figure 13A:
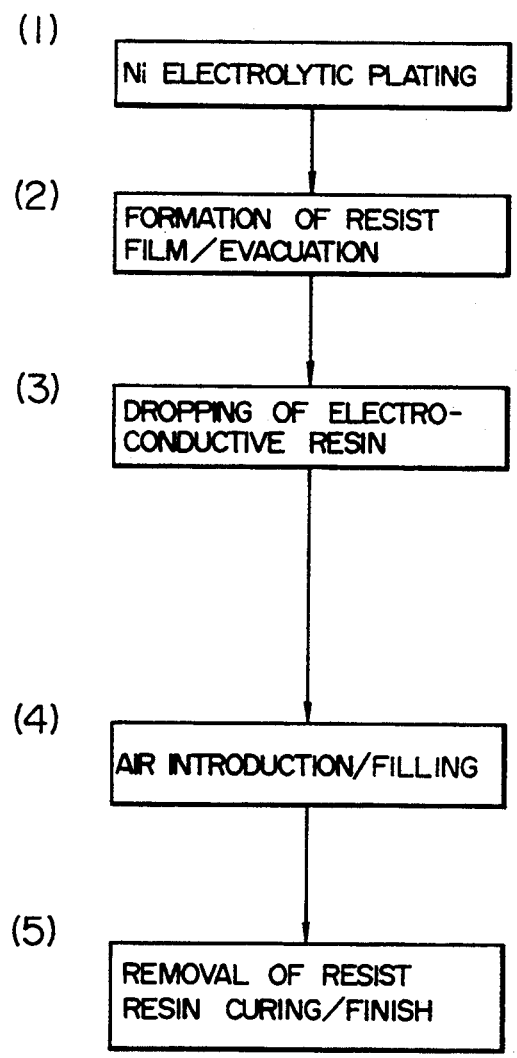
FIG. 13A is a flow sheet diagram of an example of the fourth embodiment of the process of the present invention.
Figure 13B:
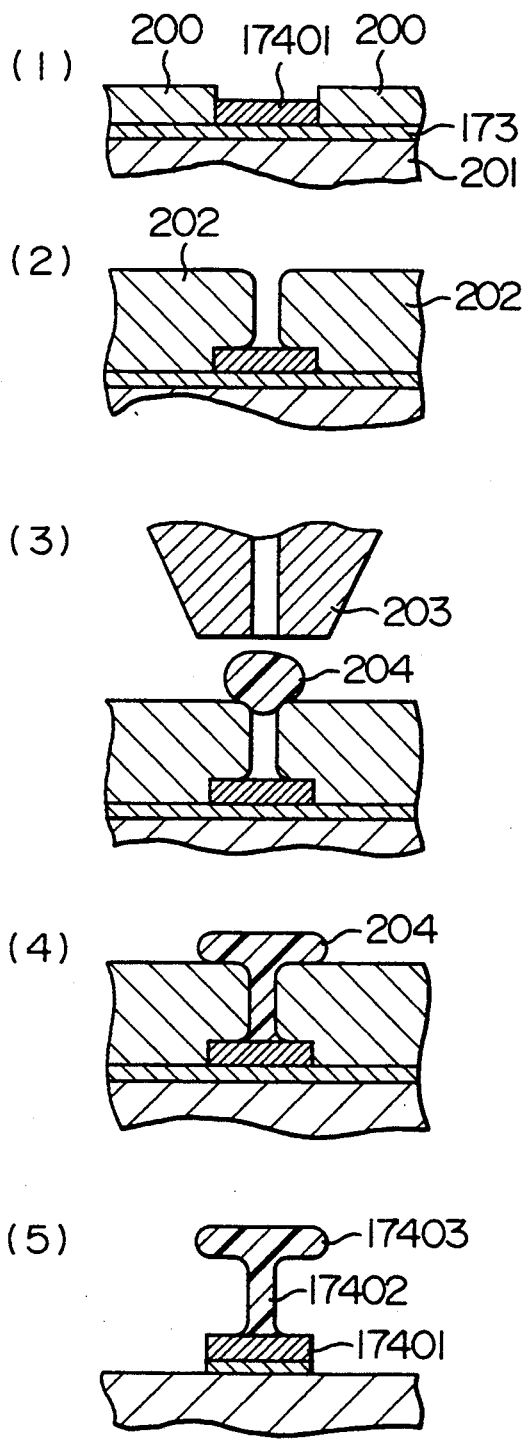
FIG. 13B shows schematic cross-sectional views corresponding to the steps of an example of the fourth embodiment of the process of the present invention.

Next, a process for manufacturing the projecting electrode of this Example will be described with reference to FIGS. 13A and 13B. FIG. 13A is a flow sheet diagram, while FIG. 13B shows cross-sectional views corresponding to steps of the process. In FIGUREs, a plated primer film 173 is indicated as one layer for simplicity, but practically composed of a two-layer laminate of a chromium film 17301 and a gold film 17302 similarly to other Examples. Structures including aluminum lines 1 71 and surface protecting film 1 72 other than the plating primer film 173 are omitted and designated as a silicon substrate 201 as a whole.

(1) A seat 17401 was produced by forming an aperture for the seat with resist 200 and then effecting electrolytic plating in the aperture. The resist used was of a positive type and the plating bath was correspondingly an acidic Watt bath.

(2) The resist 200 was removed and a resist film 202 of a thickness of about 20 μm was formed. Then, the silicon substrate 201 having the resist 202 formed on the surface thereof was placed in a vessel (not shown) which was evacuated with a rotary oil pump (not shown).

(3) With a dispenser 203, a electroconductive resin 204 was dropped on the aperture proveded in the resist 202.

(4) There was introduced air, under the pressure of which the electroconductive resin 204 was forced into the aperture in the resist 202.

(5) The resist 202 was removed. Thereafter, the electroconductive resin 204 was cured by heat-treatment at 200° C. for 20 minutes to produce a projection 17402 and a tip 17403. Finally, other portions of the plated primer film 173 than protected with the seat as a mask were etched out.

A process of manufacture is not liimtted to the one just described above. The following variations may be selected:

(a) A higher pressure than the normal atmospheric pressure is applied into the inside of the vessel to ensure the forced ingress of the resin.

(b) Decompsition of the resist is performed at the same time of the heat-treatment for curing the resin.

(c) The electroconductive resin is coated on the apertures by screen printing rather than the use of dispenser in air or vacuum.

In this Example, nickel was used for the seat, though copper, gold, and solder may be employed as a matter of course. The use of nickel was for the reasons that nickel is less liable to oxidation than copper and that there was the acidic plating bath.

EXAMPLE 5

Figure 14A:
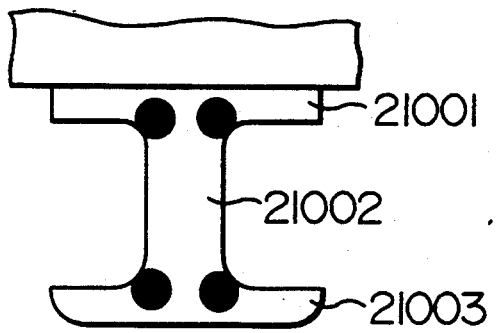
FIGS. 14A and 14B are a schematic cross-sectional view for explaining the function of the fourth embodiment of the present invention.
Figure 14B:
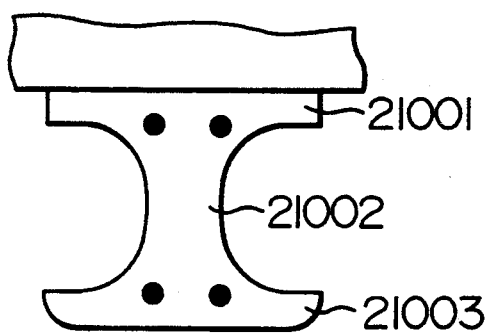
Figure 15A:
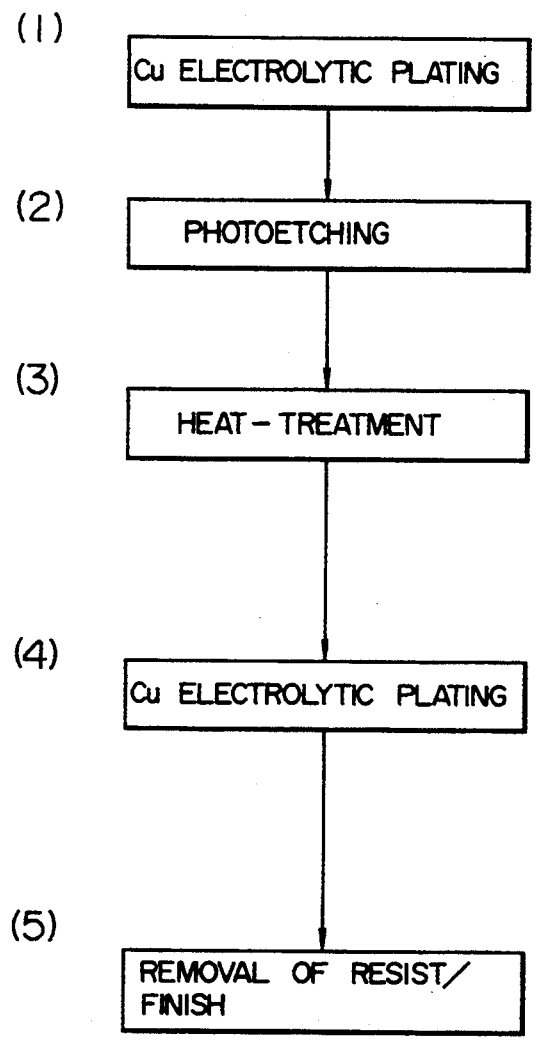
FIG. 15A is a flow sheet diagram of an example of the fifth embodiment of the process of the present invention.
Figure 15B:
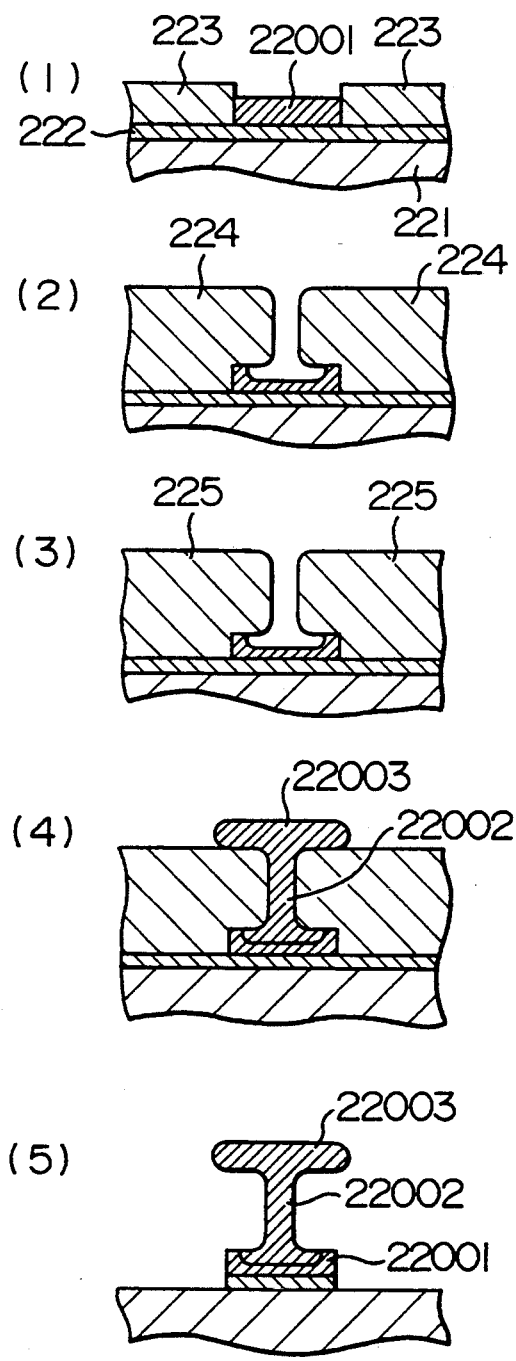
FIG. 15B shows schematic cross-sectional views corresponding to the steps of an example of the fourth embodiment of the process of the present invention.

Fifth embodiment of the present invention will be described with reference to FIGS. 14A and 14B. FIGS. 14A and 14B are schematic cross-sectional view for explaining the difference in stress concentration between a larger radius of curvature and a smaller one at the opposite flared ends of the projection. FIG. 15A is a flow sheet diagram, and FIG. 15B shows cross-sectional views corresponding to steps of the process of this Example.

This Example is a process where the radius of curvature at each of the boundary regions between the projection and the seat as well as between the projection and the tip is enlarged. First, we will review the effects depending upon the magnitude of the radius of curvature at the boundary regions between the projection and the seat as well as between the projection and the tip. FIGS. 14A and 14B show schematically the configuration of the projecting electrodes, the sites on which the maximum stess is imposed, and the magnitude of the maximum stess. The site is indicated by a black circle, the size of which signifies the magnitude of the stess. FIG. 14A shows a case of the smaller magnitude of the radius of curvature at each of the boundary regions between a projection 21002 and a seat 21001 as well as between the projection and a tip 21003, while FIG. 14B does a case of the larger magnitude. The projecting electrodes exhibit a stress distribution close to that produced in a cantilever. That is, the maximum stresses are imposed on such regions as indicated by the black circles. As can be seen from the FIG. 14B, the boundary regions between the projection 21002 and the seat 21001 as well as between the projection and the tip 21003 have a larger radius of curvature resulting in a reduction in stress concentraion. As described earlier with respect to the fourth embodiment, though the stress is dissipated through the seat 21001, it is naturally desired that the projection 21002 has a lower internal stress. This embodiment is invented based on our research for enlarging the radius of curvature.

Now, a process of manufacture of this Example will be described with reference to FIGS. 15A and 15B. FIG. 15A is a flow sheet diagram, while FIG. 15B shows cross-sectional views corresponding to steps of the process. In FIGURES, a plated primer film 222 is indicated as one layer for simplification of the drawing, but practically composed of a two-layer laminate of a chromium film and a gold film similarly to other Examples. Structures including aluminum lines and surface protecting film other than the plating primer film 222 are omitted and designated as a silicon substrate 221 as a whole.

(1) A seat 22001 was produced by forming an aperture for the seat with resist 223 and then effecting electrolytic plating in the aperture to a thickness of 5 μm. The resist used was of a positive type and the plating bath was correspondingly an acidic copper salfate solution.

(2) The resist 223 was removed and a resist film 224 having a thickness of about 20 μm was formed. Under this condition, a part of the seat 22001 was etched out with an etching solution containing major components of $(NH_4)_2S_2O_5$ and $NH_4I$.

(3) Heating at 110° C. for 30 minutes was effected under nitrogen atmosphere. Flowability of the resist 224 was increased resulting in a deformed resist 225 with a larger radius of curvature.

(4) Using the deformed resist 225, electrolytic plating was performed to produce a projection 22002 and a tip 22003.

(5) The deformed resist 225 was removed and other portions of the plated primer film 222 than protected with the seat as a mask were etched out.

This Example has an advantage of simplicity of the process, but has a disadvantage that the radius of curvature varies with varying the temperature conditions.

Figure 16A:
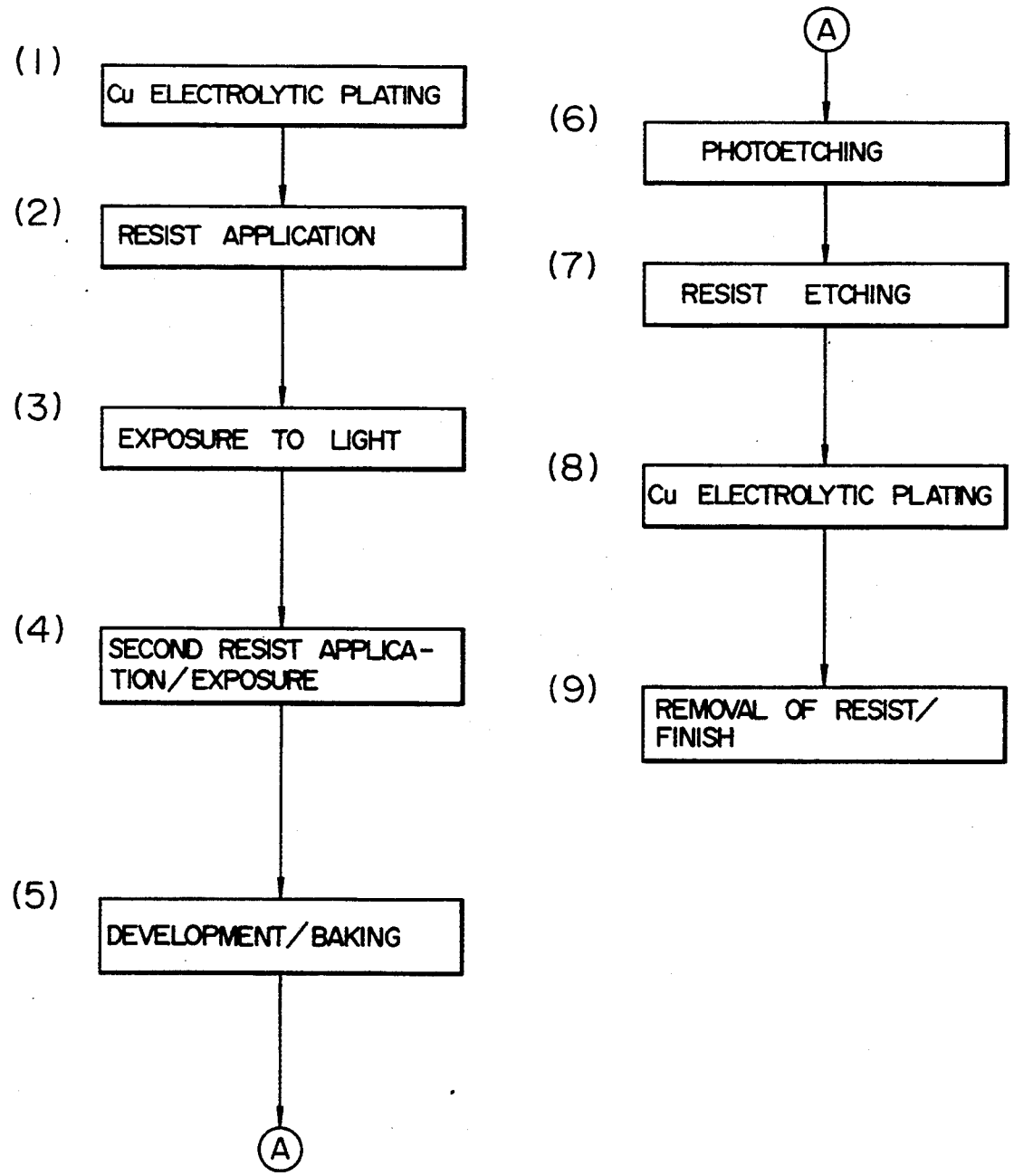
FIG. 16A is a flow sheet diagram of the first variation of the fifth embodiment of the process of the present invention.
Figure 16B:
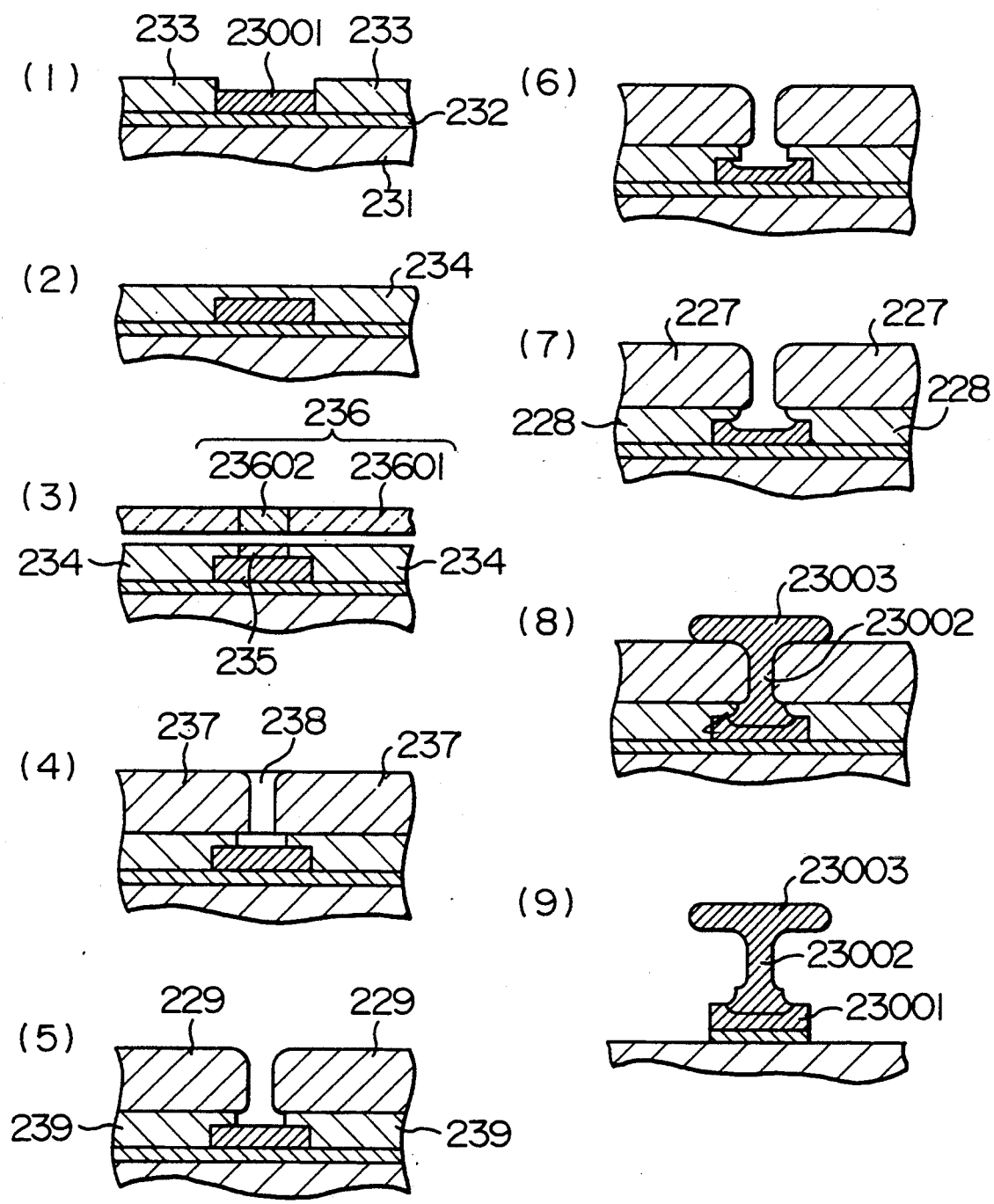
FIG. 16B shows schematic cross-sectional views corresponding to the steps of the first variation of the fifth embodiment of the process of the present invention.

Next, first variation of the process of this Example will be described with reference to FIGS. 16A and 16B. FIG. 16A is a flow sheet diagram, while FIG. 16B shows cross-sectional views corresponding to steps of the process. In the FIGUREs, a plated primer film 232 is indicated as one layer for simplification of the drawing, but practically composed of a two-layer laminate of a chromium film and a gold film similarly to other Examples. Structures including aluminum lines and surface protecting film other than the plating primer film 232 are omitted and designated as a silicon substrate 231 as a whole.

(1) A seat 23001 was produced by forming an aperture for the seat with resist 233 and then effecting electrolytic plating in the aperture to a thickness of 5 μm. The resist used was of a positive type precluding the use of alkaline plating liquid, and therefore, the plating bath was an acidic copper salfate solution.

(2) The resist 233 was removed and a non-exposed resist film 234 having a thickness of about 5 μm was applied.

(3) Exposure to light was conducted using a glass mask 236 having a black area 23601 and a transparent area 23602. The portion exposed to light of the resist is designated as an exposed resist 235.

(4) A non-exposed resist film 237 having a thickness of about 15 μm was applied. Exposure to light was effected using a glass mask (not shown) having a somewhat narrower transparent area than that of the glass mask 236 to produce an exposed resist 238. At this time, a slightly round top edge of the exposed resist was formed because the resist was thick.

(5) The resists were developed and baked. At the baking, the resists flowed slightly resulting in enlargement of the radius of curvature at the ends thereof.

(6) Under these conditions, a part of the seat 23001 was removed by etching with an etching solution containing major components of $(NH_4)_2S_2O_5$ and $NH_4I$.

(7) Developed resists 239 and 229 were etched slightly by immersing in a solution containing a mixture of acetone and water at a ratio by volume of 1:1 for ten minutes. At this time, the etching at the edges proceeded faster than at flat regions to produce a etched resists 228 and 227 with an increased radius of curvature at corners.

(8) Utilizing a laminate of the etched resists 228 and 227, electrolytic plating was performed to produce a projection 23002 and a tip 23003.

(9) The laminate of the etched resists 228 and 227 was removed and other portions of the plated primer film 232 than protected with the seat 23001 as a mask were etched out.

This variation has an advantage that since the intended radius of curvature is achieved using masks, less variation in the radius of curvature can be attained even when process conditions vary. However, the need for the repetition of resist application, baking and exposure renders the process complicated.

In this variation, the etching with acetone was conducted a little to round the edges of the resists. Such etching is advantageous because of less denaturization of the resists owing to the heat thereof as compared with the thermal process for imparting a curvature.

This variation used two layers of resist, though the number of layers can be further increased to make more smooth shape projections.

Next, second variation of this Example will be described with reference to FIG. 17A and 17B. In this variation, making use of wet etching for the formation of curvature, we could achieve a curvature at the boundary region between the seat and the projection, which curvature is difficult to form by the process in other Examples.

Figure 17A:
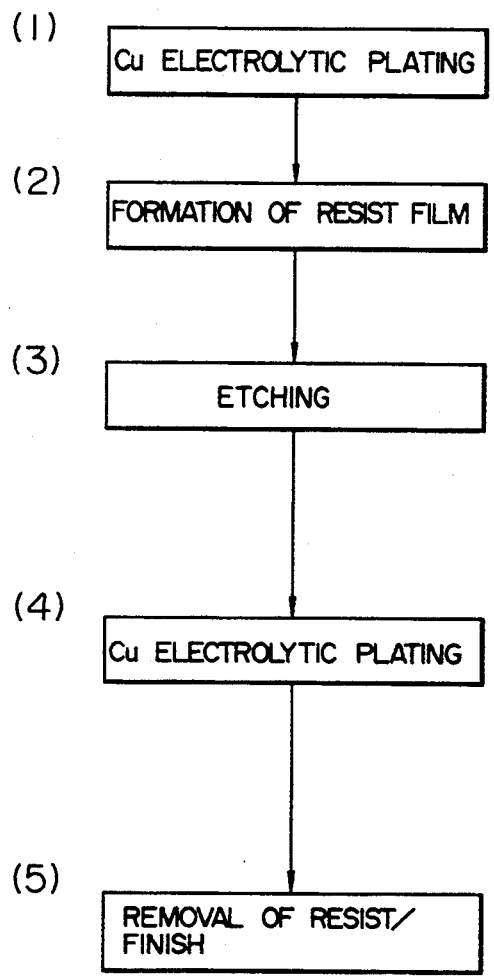
FIG. 17A is a flow sheet diagram of the second variation of the fifth embodiment of the process of the present invention.
Figure 17B:
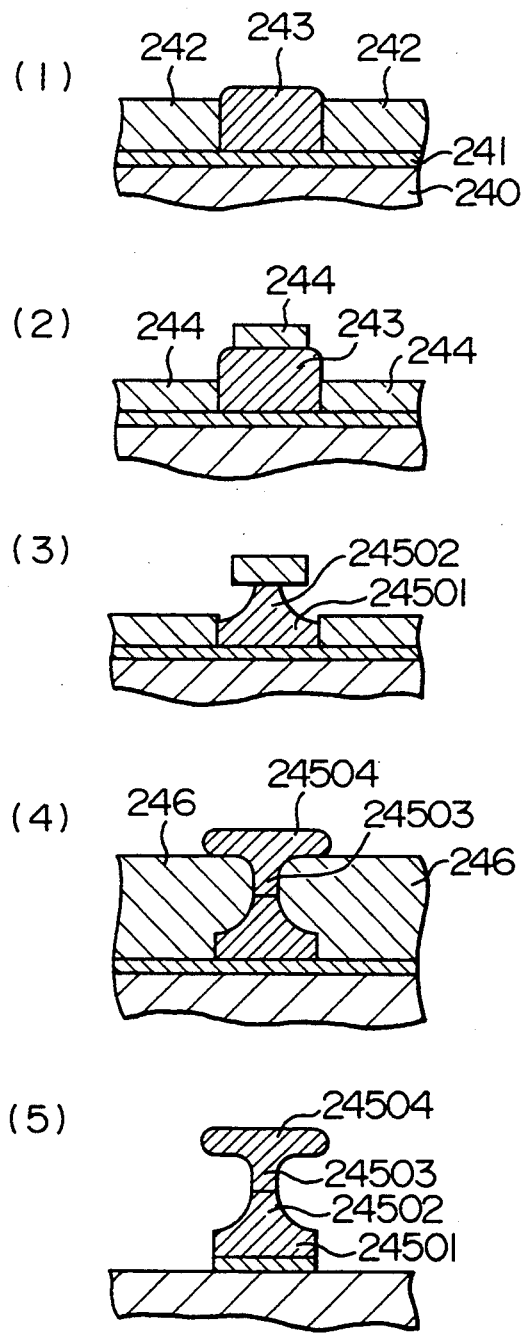
FIG. 17B shows schematic cross-sectional views corresponding to the steps of the second variation of the fifth embodiment of the process of the present invention.

FIG. 17A is a flow sheet diagram, and FIG. 17B shows cross-sectional views corresponding to steps of the process. In the FIGUREs, a plated primer film 241 is indicated as one layer for simplification of the drawing, but practically composed of a two-layer laminate of a chromium film and a gold film similarly to other Examples. Structures including aluminum lines and surface protecting film other than the plating primer film 241 are omitted and designated as a silicon substrate 240 as a whole.

(1) A pattern of a seat 24501 was formed with resist 242 and then electrolytic plating was performed to produce a projection root material 243 having a thickness of about 15 μm, though the desired end thickness of the seat 24501 was about 5 μm. Therefore, the thickness of the resist was also 15 μm.

(2) The resist 242 was removed and a resist film 244 having a thickness of about 5 μm was formed. The film consisted of a part surrounding a lower portion of the projection root material 243 which has already formed and a part covering the central portion of the projection root material 243.

(3) Under these conditions, a part of the projection root material 243 was remove by etching with an etching solution containing major components of $(NH_4)_2S_2O_5$ and $NH_4I$. Etching proceeded not only in the normal direction to the plane of the mask, but also in the parallel direction thereto. As a result, the root material 243 was made to have such a configuration as the seat 24501 and a lower projection 24502 were combined.

(4) The resist 244 was removed and a resist 246 having a thickness of about 20 μm was formed. Under these conditions, Cu electrolytic plating was conducted to produce an upper seat 24503 and a tip 24504.

(5) the resist 246 was removed and other portions of the plated primer film 241 than protected with the seat 24501 as a mask were etched out. The procedure of the etching comprised removing the gold film with an aqueous etching solution containing I and $NH_4I$ and then removing the chromium film with an aqueous etching solution containing $K_3Fe(CN)_6$ and $NaOH$.

This variation is characterized by containing no boundary between the lower projection 24501 and the seat 24502, and moreover, allowing a curvature to form at the boundary region therebetween. The latter characteristic is greatly advantageous over other Examples where it is difficult to form a curvature at such region. Although the general plating technique produces a problem of insufficient ingress of the plating solution into the aperture when the projections are slender, the present process producing only the upper half of the projection by plating does advantageously not suffer from such problem.

However, this process has a disadvantage of difficulty in stabilizing the width of the lower projection 24502. The width is an important dimension. Such disadvantage may be attributed to the fact that this process is conducted by relying upon only the timing to stop etching. This process is one of the techniques of forming the upper projection 24503 by plating integrally with the lower projection 24502 defined by etching. Therefore, there are problems of allowing both projections to coincide with each other as well as minimizing the discrepancy in their positions. As a result of the stress concentration, the projecting electrodes may break at the boundary between the upper projection 24503 and the lower projection 24502.

EXAMPLE 6

Figure 18A:
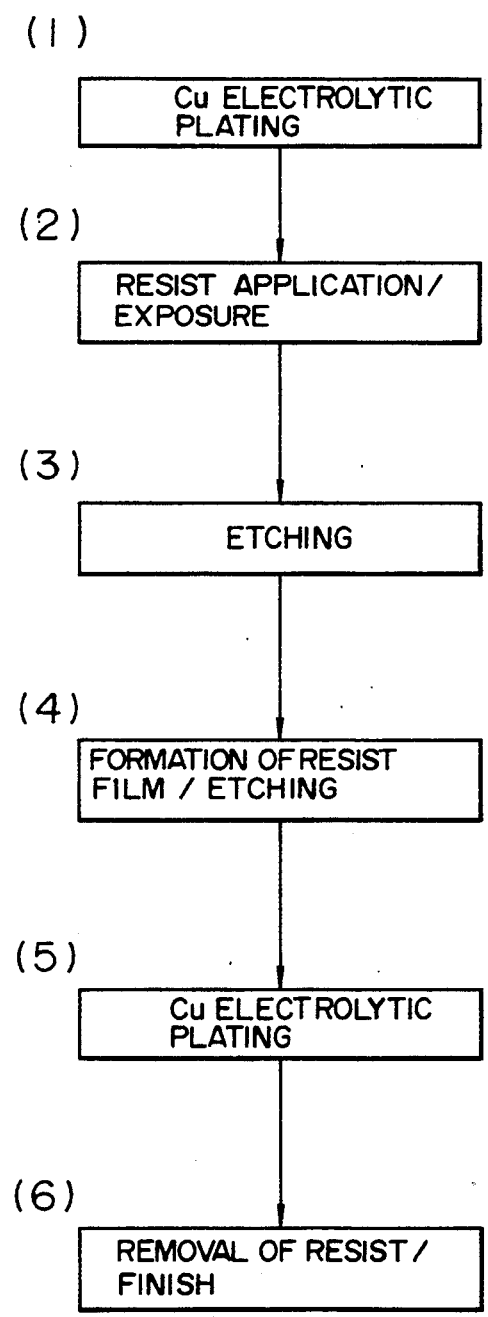
FIG. 18A is a flow sheet diagram of an example of the sixth embodiment of the process of the present invention.
Figure 18B:
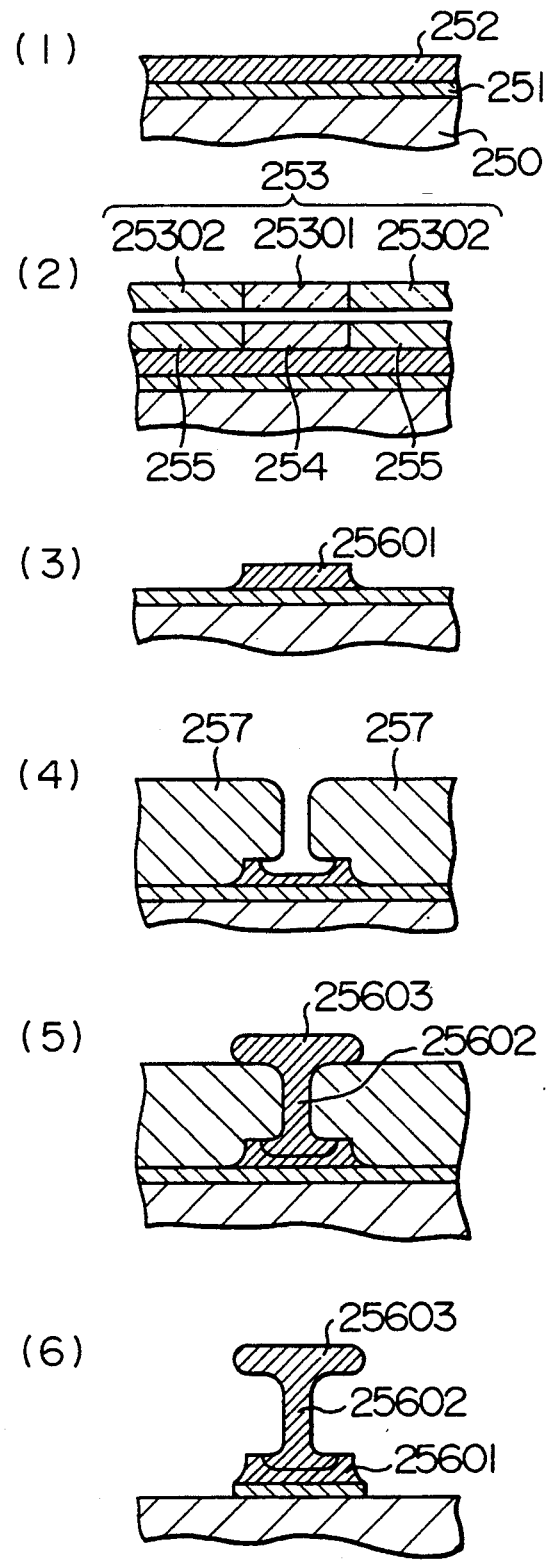
FIG. 18B shows schematic cross-sectional views corresponding to the steps of an example of the sixth embodiment of the process of the present invention.

This Example will illustrate an embodiment where the seat is formed by both plating and etching. FIG. 18A is a flow sheet diagram, and FIG. 18B shows cross-sectional views corresponding to steps of the process. In the FIGUREs, a plated primer film 251 is indicated as one layer film for simplification of the drawing, but practically composed of a two-layer laminate of a chromium film and a gold film similarly to other Examples. Structures including aluminum lines and surface protecting film other than the plating primer film 251 are omitted and designated as a silicon substrate 250 as a whole.

(1) An overall plated copper film 252 was produced by electrolytic plating to a thickness of about 5 μm.

(2) A photoresist was applied onto the film and covered with a glass mask 253. Portions of the photoresist covered with black area of the glass mask remained unexposed as designated as a non-exposed resist 254, while those covered with transparent area of the glass mask were exposed as designated as an exposed resist 255.

(3) Since a positive type resist was used, development resulted in leaving only the non-exposed resist 255. Under these conditions, a part of the overall plated copper film was remove by etching with an etching solution containing major components of $(NH_4)_2S_2O_5$ and $NH_4I$ to leave a seat 25601. As described above, wet etching proceeds not only in the normal direction to the plane of the mask, but also in the parallel direction thereto. Therefore, the lateral side of the seat 25601 has a smoothly curved slope as can be seen in the FIGUREs contributing to relaxation of stress.

(4) A resist film 257 having a thickness of about 20 μm was formed with an aperture therein, into which a solution for etching the copper was introduced to remove a part of the seat 25601.

(5) Copper electrolytic plating was conducted. As a result, a projection 25602 and a tip 25603 were formed.

(6) The resist 257 was removed and other portions of the plated primer film 251 than protected with the seat 25601 as a mask were etched out.

This Example is characterized by producing a seat of the flare type, as noted above, due to the use of etching for forming the seat. The plating techniques where a plating solution must be introduced through an aperture in the mask are apt to produce problems of insufficient ingress of the solution resulting in failed plating when very slender projections are to be made. The present process does advantageously not suffer from such problems.

EXAMPLE 7

Seventh embodiment of the present invention will be illustrated with reference to a chip-on-glass (COG) package scheme where semiconductor devices for operating liquid crystal devices are directly loaded on a glass substrate for a liquid crystal display.

Figure 19:
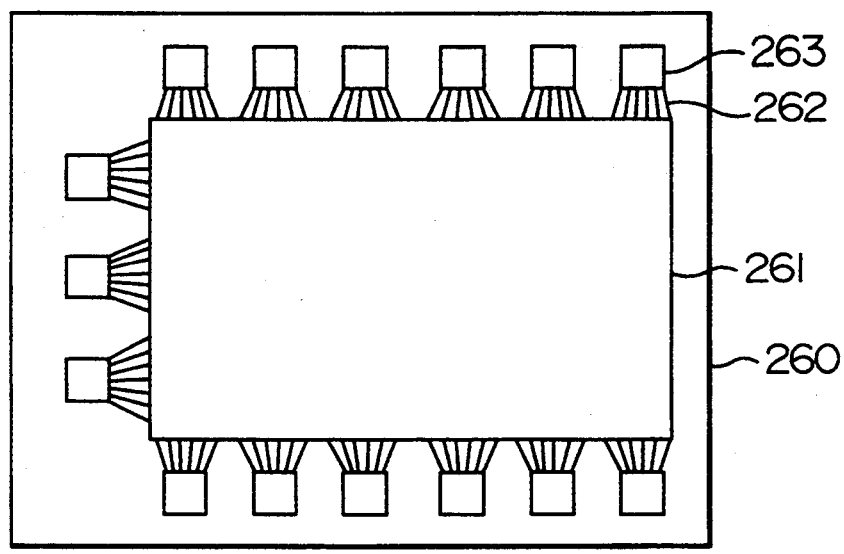
FIG. 19 is a diagrammatical view of the appearance of a liquid crystal display device.

A diagrammatical view of a liquid crystal display apparatus is shown in FIG. 19. On a glass substrate 260, there is formed a liquid crystal display 261, from which lines 262 are derived in the abscissa direction as well as in the ordinate direction. In the case of a liquid crystal display in color for use in personal computers, the number of the lines 262 includes 480 lines in the ordinate direction and a total of 1920 lines in the abscissa direction for three primary colors, each having 640 lines. In order to operate the liquid crystal display 261 with these lines 262, semiconductor devices 263 are loaded in a ratio of one device per 160 scanning lines on the glass substrate.

The lines 262 on the glass substrate 260 were made of ITO (a mixed oxide of indium and tin) and electrode pads for connection are aligned along the peripheries of the semiconductor devices. The electrode pads for the semiconductor devices 263 had a pitch of about 50 μm.

As a technique for connecting the electrode pads with such fine pitch, the use of anisotropic electroconductive films is popular.

This technique is to interpose an anisotropic electroconductive film containing electroconductive particles dispersed between the semiconductor devices and the glass substrate and then press the resultant composite under heat to effect connection. By applying a pressure at the time of effecting the connection, the electroconductive particles sandwiched between the electrode pads on the side of the semiconductor device and those on the side of the substrate are deformed to connect the overlaying electrode and the underlying electrode with each other. The remaining electroconductive particles are present discretely in the film so that they can not transmit any current.

This technique is effective in the case of achieving the connections with fine pitches. However, it suffers from less reliability at the time of cycling in temperature.

The bump to be used in this example will be described under.

This projecting electrode comprises a plate shape electrode having an ellipse cross-section in a plane parallel to the semiconductor device connection plane, which ellipse shape has a ratio of the larger dimension to the shorter dimension exceeding one. The projecting electrodes having such configuration exhibit a high rigidity to be less deformable when a load is applied in the direction parallel to the larger dimension in the cross-section. However, they exhibit a lower rigidity to be liable to deformation when a load is applied in the direction parallel to the shorter dimension in the cross-section. Such configuration enable the projecting electrodes to assure a necessary rigidity and flexibility, and in addition, to maximize the current-conducting cross-section area of the projecting electrodes. Thus, if the projecting electrodes are made of conductive materials (e.g., copper), their current resistances can be minimized.

The projecting electrodes are provided on their tips with a mushroom type head, which has effects to facilitate the connection with the electrode pads on the side of the glass substrate as well as to enhance the strength after completed the connection.

A package structure with the projecting electrodes as described above will be illustrated hereunder.

In this semiconductor device package structure, the electrode pads on the side of the semiconductor device are connected with those on the side of the glass substrate via the projecting electrodes. The former pads are aligned along the peripheries of the semiconductor devices in a connection plane, while the latter pads are positioned corresponding to the former pads. These projecting electrodes are arranged so that all the projecting electrodes are distributed to the electrode pads on the side of the semiconductor device with one projecting electrode abutting on one pad. All the projecting electrodes, each having a larger dimension and a shorter dimension in the cross-section taken in a plane parallel to the semiconductor device connection plane, are also arranged in a manner that the direction of the shorter dimension passes through the center of the chip, When the liquid crystal display apparatus is operated, the semiconductor devices generate heat causing a displacement of one of the semiconductor device and the glass substrate relative to the other at the boundary therebetween, which displacement is attributed to the difference in thermal expansion coefficient between the semiconductor device and the glass substrate. The aforementioned arrangement of the projecting electrodes allows this displacement to be offset by their deformation. Notwithstanding, the arranged projecting electrodes have a high rigidity as a whole to be not easily deformed against external forces, thereby achieving a high reliability.

The projecting electrodes can accommodate themselves to variations in the size of the semiconductor device and in the difference in thermal expansion coefficient by changing their height and configuration.

EXAMPLE 8

Eighth embodiment of the present invention will be described.

On an electrode pad, there are formed a plurality of projecting electrodes which are used for connecting the electrode pads on the side of the semiconductor device with those on the side of the glass substrate, thereby obtaining a connection structure having a high reliability.

The arrangements where a plurality of projecting electrodes are disposed on single electrode pad include grid type arrangement, series arrangement aligned in the direction passing through the center of the chip, and parallel arrangement normal to the direction passing through the center of the chip.

In any case, each projecting electrode having a larger dimension and a shorter dimension in the cross-section in a plane parallel to the semiconductor device connection plane is disposed in a manner as the direction of the larger dimension crossing normally to the direction passing through the center of the chip. The plurality of projecting electrodes may have a mushroom type head formed on the tip of the projection. Alternatively, a plurality of the heads may be combined into a single head to facilitate the connection with the electrode pads on the side of the glass substrate. In the case of the arrangement where the projecting electrodes are disposed in a grid configuration, or in a series aligned in the direction passing through the center of the chip, the formation of the single head can achieve an effect of offsetting the stress imposed on the boundary between the head and the electrode pad in the direction separating from each other because the head may shift parallel to the electrode pads on the side of the semiconductor device, when a displacement is caused by thermal expansion.

The projecting electrodes may be made of any one of materials having an electroconductivity and at least a strength capable of retaining the semiconductor devices. Copper is a preferred material in view of electroconductivity, strength and formability. Alternatively, the projecting electrodes may be manufactured by forming the bulk body with a material having no electroconductivity itself such as resin and coating the body with an electroconductive material so as to have an electroconductivity. Still alternatively, the projecting electrodes may be manufactured by forming the bulk body with resin, perforating the body to form a through hole communicating from the electrode pads on the side of the semiconductor device to those on the side of the glass substrate, and coating the inside of the through hole with an electroconductive material such as metal, thereby imparting an electroconductivity to the projecting electrodes.

Alternatively, the projecting electrodes may be made of an electroconductive resin containing electroconductive particles dispersed.

EXAMPLE 9

Ninth embodiment of the present invention will be described.

A process for connecting the projecting electrodes formed on the electrode pads on the side of the semiconductor device with the electrode pads on the side of the glass substrate will be described.

In one of intended processes, an anisotropic electroconductive film is attached onto the surface on the side for connection of the glass substrate. Then, on the film, there are placed the projecting electrodes which have been formed on the electrode pads on the side of the semiconductor device. The projecting electrodes are forced toward the glass substrate to deform the electroconductive particles in the anisotropic film so as to establish electric communication. Under these conditions, the film is heated to cure to complete the connection.

Alternatively, first, an electroconductive paste such as silver paste or gold paste is applied onto the electrode pads on the side of the glass substrate by printing. Then, on the paste are placed the projecting electrodes which have been formed on the electrode pads on the side of the semiconductor device at correct positions, thus establishing the connection. Therafter, the electroconductive paste is heated to cure to complete the connection.

When a material having a lower corrosion resistance is used for the projecting electrodes, a high wettability resin is applied onto the glass substrate after loading to cover around the projecting electrodes making a corrosion resistant film to enhance the corrosion resistance of the projecting electrodes.

EXAMPLE 10

Figure 20A:
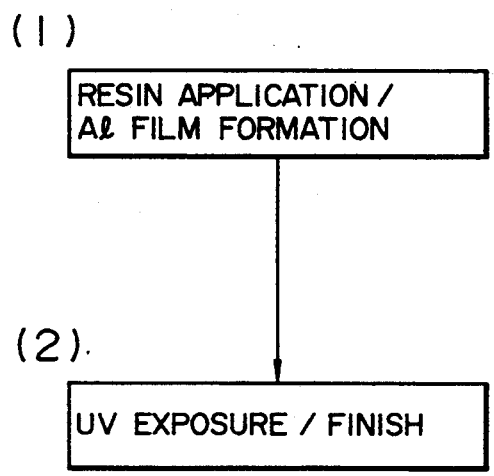
FIGS. 20A and 20B show a flow sheet diagram and schematic cross-sectional views corresponding to the steps of an example of the tenth embodiment of the process of the present invention.
Figure 20B:
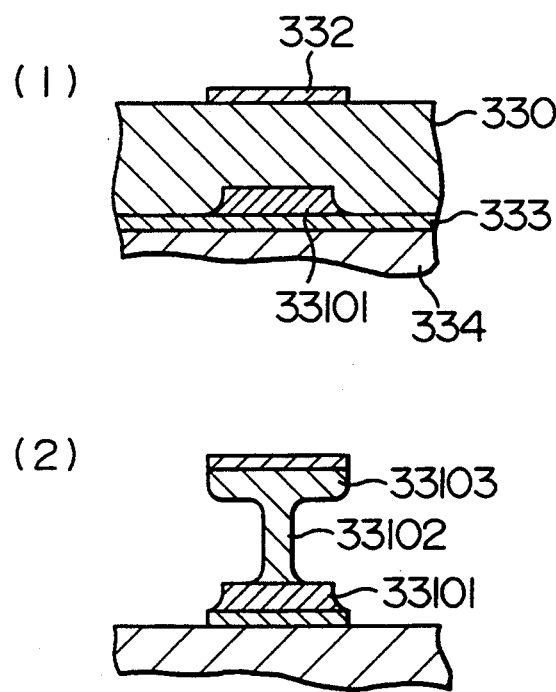

Tenth embodiment of the present invention will be described with reference to FIG. 20.

This example is to manufacture projecting electrodes by an etching process with an electroconductive resin.

First half of the process is the same as that in Example 6, and therefore, description thereof will be omitted. The following is for description of the steps after the stage (3) shown in FIG. 18A is completed.

(1) A resin 330 containing electroconductive particles 330 was applied to a thickness of 20 $\mu$m. Directly above a seat 33101, there was formed by photolithography or other techniques an oval pattern of aluminum 332 having a thickness of about 1 $\mu$m.

(2) Exposure to a ultraviolet laser having a wavelength of 258 nm at an intensity of about 0.6 J/cm$^2$ was conducted. Deffraction phenomenon of light caused formation of a projection 33202 and a tip 33103. Thereafter, a plated primer film 333 was etched to remove portions thereof other than protected with the seat to complete a projecting electrode 331.

The structure in this Example, similarly to Example 6, is characterized in that the seat 33101 has a flared end because the seat 33101 is formed by etching. When very slender projections are to be made, such a technique as effecting the plating through an aperture provided in the mask is apt to encounter difficulties of imperfect ingress of resin and less capability of forming projections. The present process does advantageously not suffer from such difficulties.

EXAMPLE 11

Figure 21A:
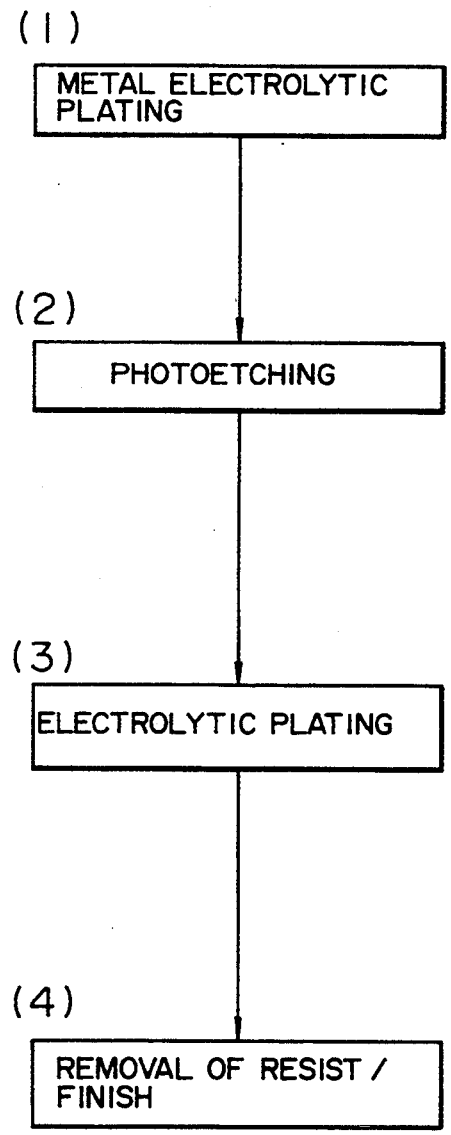
FIG. 21 shows a flow sheet diagram and schematic cross-sectional views corresponding to the steps of an example of the eleventh embodiment of the process of the present invention.
Figure 21B:
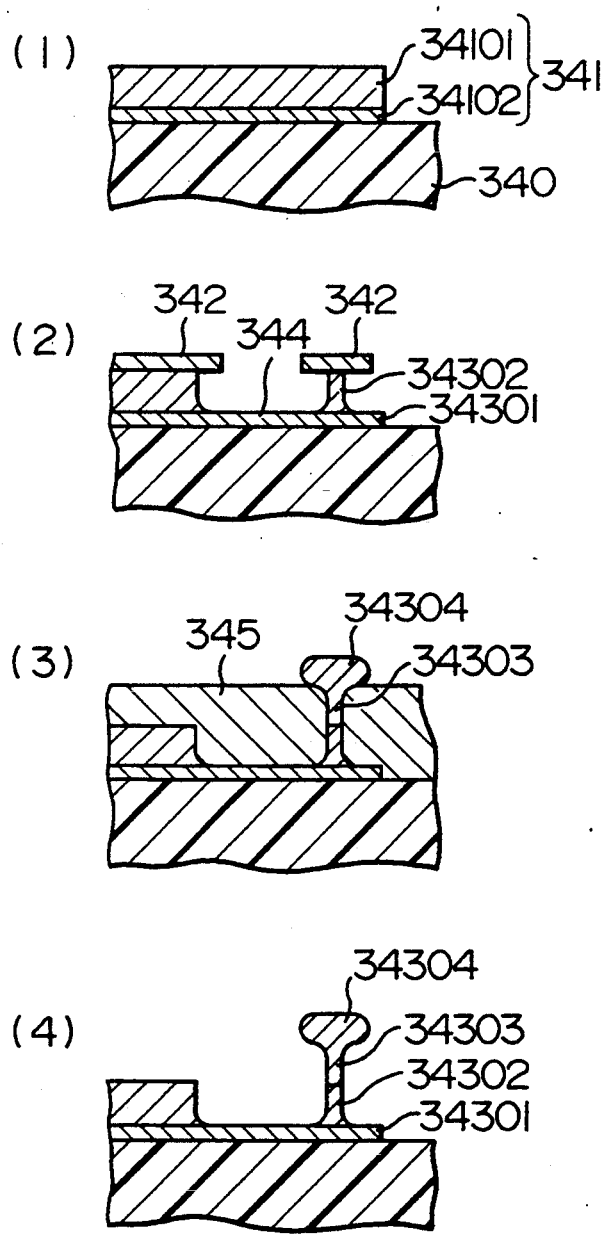

Eleventh embodiment of the present invention will be illustrated with reference to FIG. 21.

(1) On a flexible polyimide film 340, there was formed a circuit layer 341 containing a copper film having a thickness of about 20 $\mu$m. In order to increase adhesiveness, a chromium film 34102 having a thickness of about 3 μm was interposed between the copper film 34101 and the flexible film 340.

(2) Using a positive resist and a glass mask (not shown), as in Example 6, a pattern 342 for etching was formed. Under these conditions, the copper film 34101 was etched with a Cu-etching solution. As a result, the chromium film 34102 was left, to form a shape comprising a projection seat 34301 and a circuit layer 344. At the same time, a lower projection 34302 was produced.

(3) A resist 345 having a thickness of about 20 μm was formed, and an aperture provided in the resist was used for etching the tip of the lower projection 34302 by introducing a Cu-etching solution in the aperture in order to ensure adhesiveness. Next, copper was electrolytically deposited. As a result, an upper projection 34303 and a tip 34304 were formed.

(4) The resist 345 was removed.

This Example described the formation of the projecting electrodes rather than semiconductor devices on the flexible film and it is advantageous in that there is no need to add any additional processing to the semiconductor devices. As described earlier with respect to the prior art, the magnitude of pitches is limited in the accuracy of processing the copper film.

EXAMPLE 12

This example provides a structure comprising a resin substrate, a so-called print circuit board, loaded with semiconductor devices 351 which contain the projecting electrodes having flared end of a large radius of curvature as described in Example 5.

Figure 22:
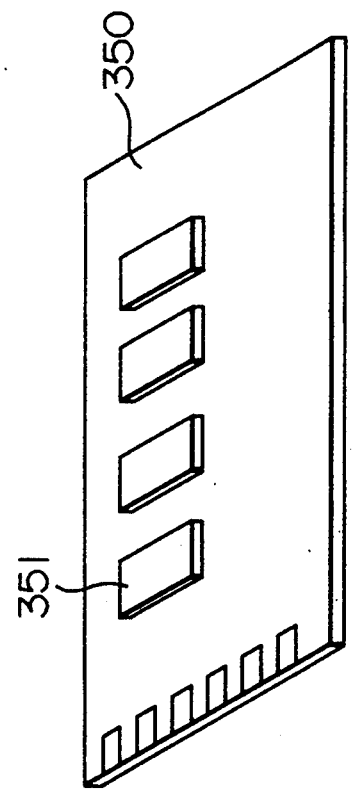
FIG. 22 is a perspective view of an example of the twelfth embodiment of the present invention.

FIG. 22 shows the appearance of the structure. Since a print circuit board 350 has a high thermal expansion coefficient, it is necessary to employ a structure having a great relaxation ability to stress for connection with the board. The use of the projecting electrodes manufactured in Example 5 could achieve a satisfactory reliability. For end use, the print circuit board was packaged to produce an IC card.

EXAMPLE 13

Thirteenth embodiment of the present invention will be illustrated.

Figure 23B:
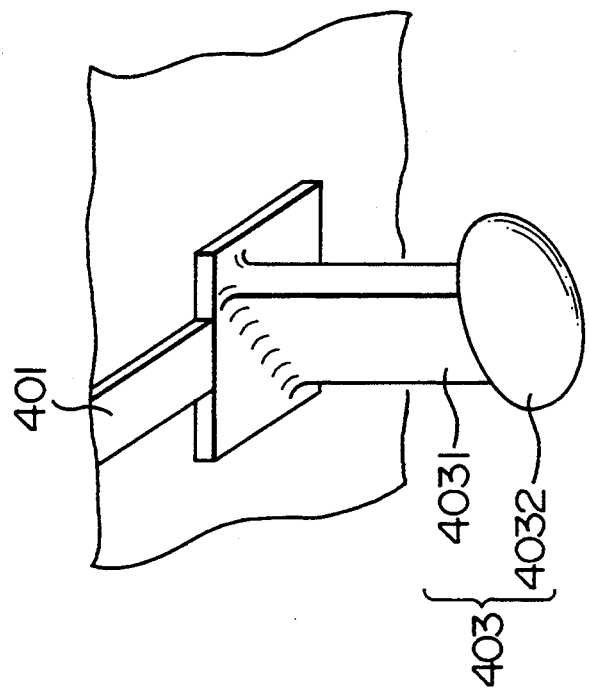
FIGS. 23A and 23B are a perspective view of an example of the thirteenth embodiment of the present invention as viewed diagonally from underside.
Figure 23A:
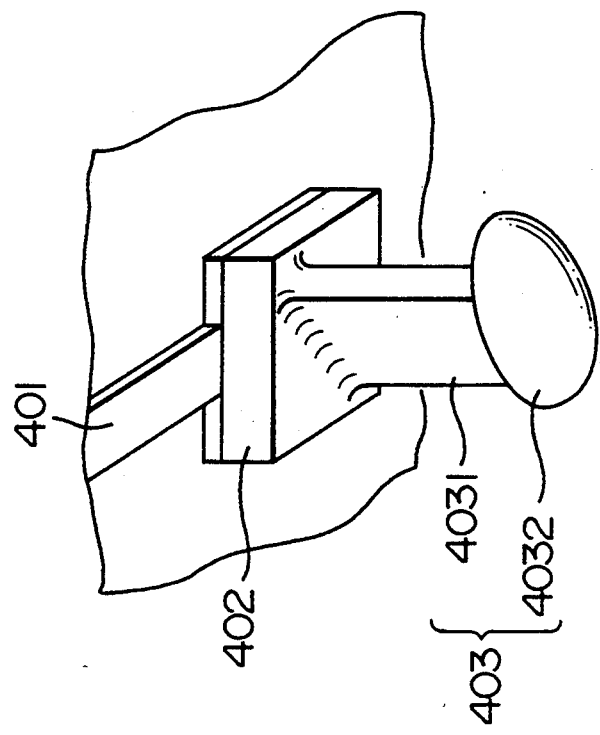

FIGS. 23A and 23B show perspective views of examples of the thirteenth embodiment of the present invention as viewed diagonally from underside.

This Example describes the structure of a projecting electrode with a seat 402 being removed.

In the Example 5 as described earlier, the package structure provided with one or a plurality of projecting electrodes 403 on a seat 402 was illustrated as shown in FIG. 23A. However, such package structure requires repeating the photo-processing two or more times resulting in complexity of the process for manufacturing projecting electrodes and an increase in production cost.

In this Example, the seat 402 is omitted as shown in FIG. 23 B. This structure lowers the strength of the connection of the end 401 of the underlying aluminum line with the projecting electrode 403 because the boundary area therebetween is reduced. However, since the projecting electrodes have an elongated projection 4031 to the extent of removal of the seat 402 with no change effected in the head 4032, the stress on the bump will be smaller. Moreover, the process for manufacturing the projecting electrode structure according to this Example enables the photo-processing to repeat reduced times so that it is possible to simplify the process and to supress the production cost.

A process for manufacturing the structure in this Example will be illustrated.

Figure 24A:
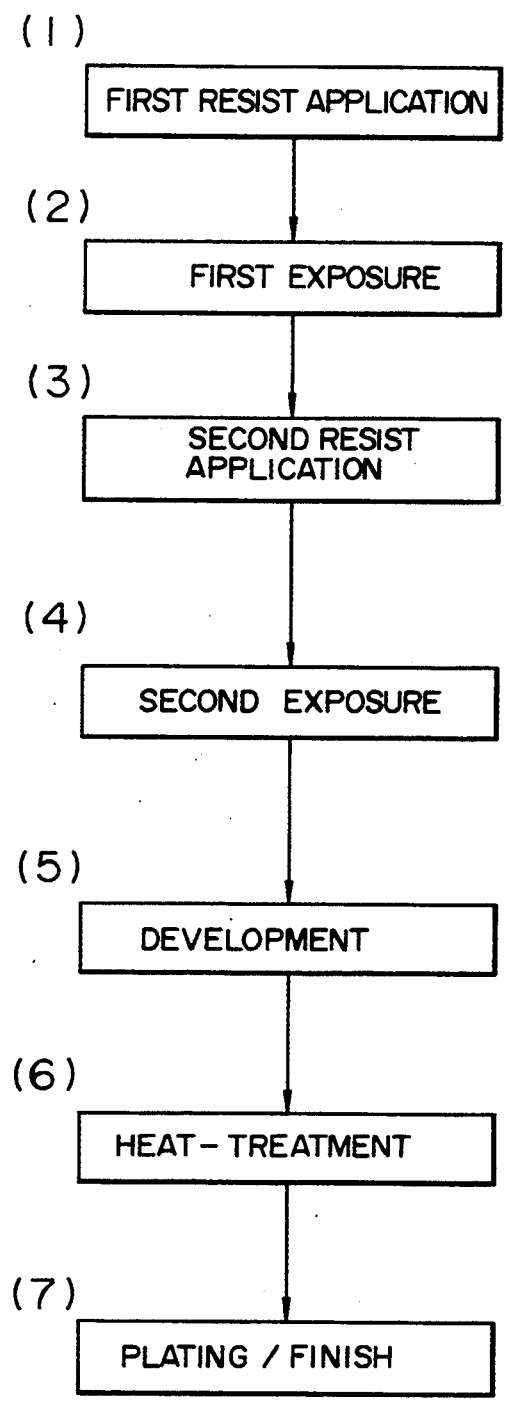
FIG. 24 shows a flow sheet diagram and schematic cross-sectional views corresponding to the steps of an example of the thirteenth embodiment of the process of the present invention.
Figure 24B:
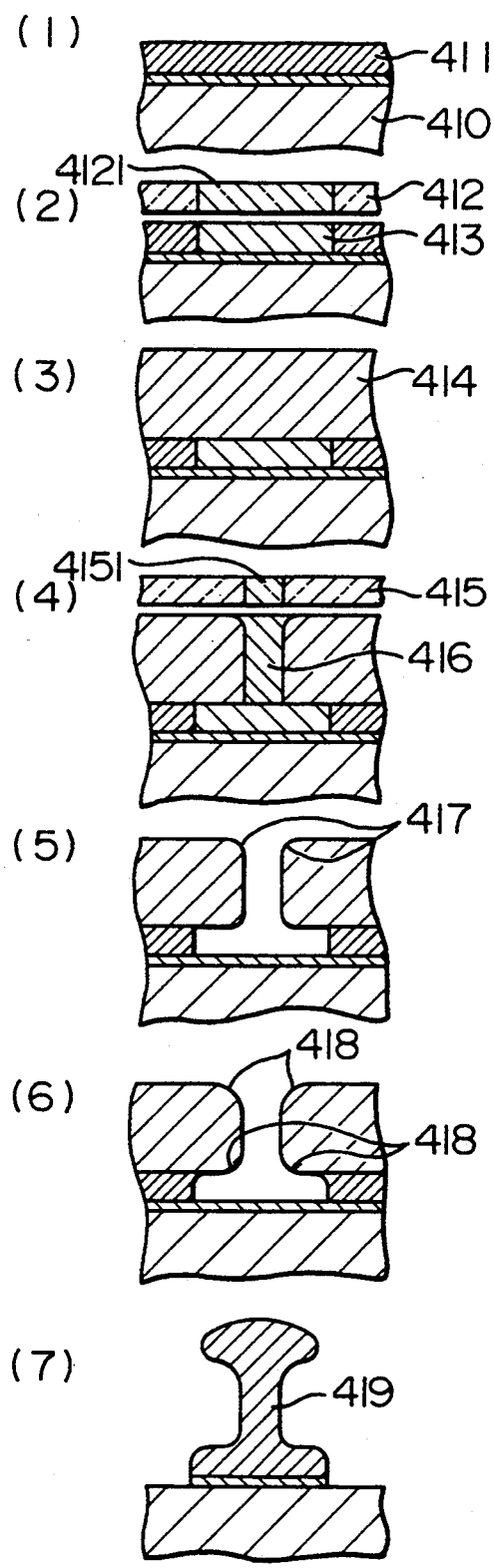

FIG. 24 is for illustrating the process for manufacture according to the thirteenth embodiment of the present invention.

In order to manufacture the projecting electrodes as described above, first a resist 411 was applied onto the surface of a silicon substrate 410 to a thickness of about 5 μm. The resist was exposed to light through a glass mask 412 having a transparent area 4121 of a size which was larger than the cross-sectional size of a projecting electrode to be produced and coincident with that of a connection electrode to be produced on the silicon substrate 410. The portion of the resist exposed to light is designated as resist 413. Onto the resist, a non-exposed resist 414 was applied to a thickness of 15 μm, and exposed to light through a glass mask 415 having a transparent area 4151 of a size which was coincident with the cross-sectional size of the neck of a projecting electrode to be produced, thereby producing an exposed resist 416 in the portion corresponding to the neck of the projecting electrode.

The resists were developed and baked. In the development, the two-layered exposed resists 413 and 416 were developed simultaneously. At the time of baking, the resists were slightly flowed to enlarge the radius of curvature 417 at the corners. The resists were subjected to heat-treatment to allow further enlargement of the radius of curvature as designated as 418.

Making use of this resist laminate, an electrolytic plating was effected to form a projecting electrode 419. The resist laminate was removed and the plated primer film was etched to remove portions thereof other than protected with the bottom of the projecting electrode as a mask.

In this way, the projecting electrode was manufactured in this Example.

The present invention enables relaxation of the stress due to the difference in thermal expansion coefficient between the electronic parts and the circuit board and hence production of a electronic parts loaded module having an elongated life and a higher reliability.

What is claimed is:

1. An electronic part-loaded module comprising a circuit board and electronic parts, each of said electronic parts being connected to said circuit board via a plurality of projecting electrodes, each of said projecting electrodes having a narrowed portion between a first face thereof connecting with said electronic parts and a second face thereof connecting with said circuit board, said narrowed portion being disposed in such a manner that said projecting electrodes have a smaller width in a direction parallel to a direction in which a maximum thermal stress is formed in said circuit board and said electronic parts in the vicinity of the connections with said projecting electrodes due to a difference in coefficient of thermal expansion between said electronic parts and said circuit board, than in a direction normal to said direction in which the maximum thermal stress is formed.

2. An electronic part-loaded module according to claim 1, wherein said narrowed portion of said projecting electrodes has a substantially rectangular contour in a cross section thereof in a direction parallel to the major surface of said circuit board, and wherein said projecting electrodes are disposed in such a manner that a direction of a shorter side of the rectangular cross section is substantially parallel to the direction in which said maximum thermal stress is formed.

3. An electronic part-loaded module according to claim 1, wherein said narrowed portion of said projecting electrodes has a substantially oval contour in the cross section thereof in a direction parallel to the major surface of said circuit board, and wherein said projecting electrodes are disposed in such a manner that a direction of a minor axis of the oval cross section is substantially parallel to the direction in which said maximum thermal stress is formed.

4. An electronic part-loaded module according to claim 1, wherein said plurality of projecting electrodes are disposed along a periphery of said electronic parts.

5. An electronic part-loaded module according to claim 1, wherein said plurality of projecting electrodes are disposed in such a manner that they surround a central area of the surface of said electronic part on which they are mounted.

6. An electronic part-loaded module according to claim 1, wherein said electronic parts are semiconducting elements and said circuit board is a glass substrate.

7. An electronic part-loaded module according to claim 1, wherein said projecting electrodes have a height of 10–30 $\mu$m.

8. An electronic part-loaded module comprising a circuit board and electronic parts, each of said electronic parts being connected to said circuit board via a plurality of projecting electrodes, said plurality of projecting electrodes being disposed in such a manner that they surround a center point of a surface of said electronic part on which they are mounted, and each projecting electrode having a narrowed portion between a first face thereof connecting with said electronic parts and a second face thereof connecting with said circuit board, said narrowed portion of said projecting electrodes having a substantially rectangular contour with a pair of longer sides parallel to one another and a pair of shorter sides parallel to one another in a cross section thereof in a direction parallel to the major surface of said circuit board, wherein said rectangular contour has a longitudinal axis extending parallel to the longer sides and a transverse axis extending parallel to the shorter sides, and wherein each of said projecting electrodes is disposed so that the transverse axis of the rectangular cross section of each projecting electrode will be on a radial line extending from the center point of the surface of the electronic part to the projecting electrode.

9. An electronic part-loaded module comprising a circuit board and electronic parts, each of said electronic parts being connected to said circuit board via a plurality of projecting electrodes, said plurality of projecting electrodes being disposed in such a manner that they surround a center point of a surface of said electronic parts on which they are mounted, and each projecting electrode having a narrowed portion between a first face thereof connecting with said electronic parts and a second face thereof connecting with said circuit board, said narrowed portion of said projecting electrodes having a substantially oval contour in a cross section thereof in a direction parallel to the major surface of said circuit board, wherein each of said oval cross sections has a longitudinal axis through a center point of the oval cross section and through opposite apex points on said oval cross sections to define a maximum length of said oval cross section, and a transverse axis extending through the center point of the oval cross section perpendicular to the longitudinal axis, and wherein each of said projecting electrodes is disposed so that the transverse axis of the oval cross section of each projecting electrode will be on a radial line extending from the central point of the surface of the electronic part to the projecting electrode.

* * * * *